(12) United States Patent
Kimura et al.

(10) Patent No.: US 8,804,405 B2
(45) Date of Patent: Aug. 12, 2014

(54) MEMORY DEVICE AND SEMICONDUCTOR DEVICE

(75) Inventors: Hajime Kimura, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 234 days.

(21) Appl. No.: 13/492,961

(22) Filed: Jun. 11, 2012

(65) Prior Publication Data

US 2012/0320663 A1 Dec. 20, 2012

(30) Foreign Application Priority Data

Jun. 16, 2011 (JP) .................................. 2011-133886

(51) Int. Cl.
*G11C 11/24* (2006.01)

(52) U.S. Cl.
USPC ..................... 365/149; 365/233.1; 365/185.05

(58) Field of Classification Search
CPC .............................. G11C 27/024; G11C 7/222
USPC ................... 365/149, 233.1, 185.05
See application file for complete search history.

(56) References Cited

U.S. PATENT DOCUMENTS

| | | | |
|---|---|---|---|
| 5,528,032 | A | 6/1996 | Uchiyama |
| 5,731,856 | A | 3/1998 | Kim et al. |
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 6,741,489 | B2 | 5/2004 | Takasu et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

*Primary Examiner* — Tuan T Nguyen
(74) *Attorney, Agent, or Firm* — Fish & Richardson P.C.

(57) ABSTRACT

A memory device with low power consumption is provided. A memory device includes a first logic element generating an output potential by inverting a polarity of a potential of a signal including data in accordance with a first clock signal; second and third logic elements holding the output potential generated by the first logic element; a switching element including a transistor; and a capacitor storing the data by being supplied with the output potential of the first logic element which is held by the second and third logic elements via the switching element. The second logic element generates an output potential by inverting a polarity of an output potential of the third logic element in accordance with a second clock signal different from the first clock signal, and the third logic element generates an output potential by inverting a polarity of the output potential of the second logic element.

21 Claims, 21 Drawing Sheets

(56) References Cited

U.S. PATENT DOCUMENTS

| | | |
|---|---|---|
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,593,856 B2 * | 11/2013 | Koyama et al. ............. 365/149 |
| 8,614,916 B2 * | 12/2013 | Nagatsuka et al. ...... 365/185.05 |
| 8,654,571 B2 * | 2/2014 | John et al. ................... 365/154 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0124094 A1 | 5/2010 | Kimura |
| 2011/0010493 A1 | 1/2011 | Kimura et al. |
| 2011/0156024 A1 | 6/2011 | Koyama et al. |
| 2011/0176357 A1 | 7/2011 | Koyama et al. |
| 2011/0187410 A1 * | 8/2011 | Kato et al. ............... 365/189.05 |
| 2011/0249487 A1 * | 10/2011 | Saito et al. ................... 365/149 |
| 2012/0287702 A1 * | 11/2012 | Fujita ............................ 365/149 |
| 2013/0223135 A1 * | 8/2013 | Koyama ........................ 365/149 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 07-121444 A | 5/1995 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-152506 A | 5/2003 |
| JP | 2004-103957 A | 4/2004 |
| JP | 2004-273614 A | 9/2004 |
| JP | 2004-273732 A | 9/2004 |
| JP | 2006-050208 A | 2/2006 |
| JP | 2009-206942 A | 9/2009 |
| JP | 2010-124290 A | 6/2010 |
| WO | 2004/114391 A1 | 12/2004 |

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

(56) References Cited

OTHER PUBLICATIONS

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO ($Ga_2O_3$-$In_2O_3$-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on $SrTiO_3$ With Sputtered $Al_2O_3$ Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,$YbFe_2O_4$, and $Yb_2Fe_3O_7$ Types of Structures for Compounds in the $In_2O_3$ and $Sc_2O_3$-$A_2O_3$-BO Systems [A; Fe, Ga, or Al; B: Mg, Mn, Fe, Ni, Cu,or Zn] at Temperatures Over 1000° C," Journal of Solid State Chemistry, 1985, vol. 60, pp. 382-384.

(56) References Cited

OTHER PUBLICATIONS

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits, 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," Nirim Newsletter, Mar. 1995, vol. 150, pp. 1-4 with English translation.

Nakamura, M et al., "The phase relations in the In2O3-Ga2ZnO4-ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In-Ga-Zn-Oxide TFTS With a Novel Passivation Layer," SID Digest '09 : SID International Symposium Digest of Technical Papers, May 31, 2009, pp. 284-287.

* cited by examiner

Period 6

FIG. 6A
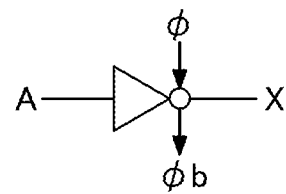
FIG. 6B
| φ | φb | A | X |
|---|----|---|---|
| H | L  | H | L |
| H | L  | L | H |
| L | H  | / | Z |
Z: High Impedance
FIG. 6C
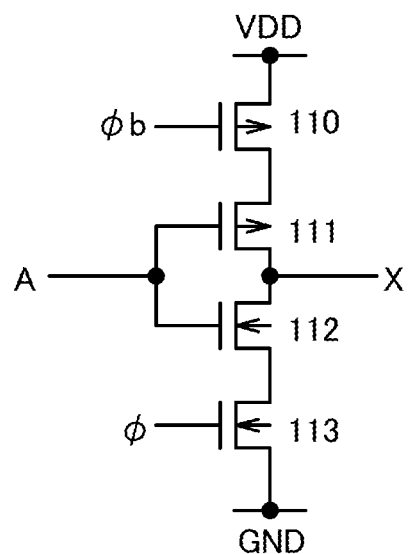

FIG. 19A
FIG. 19B
FIG. 19C
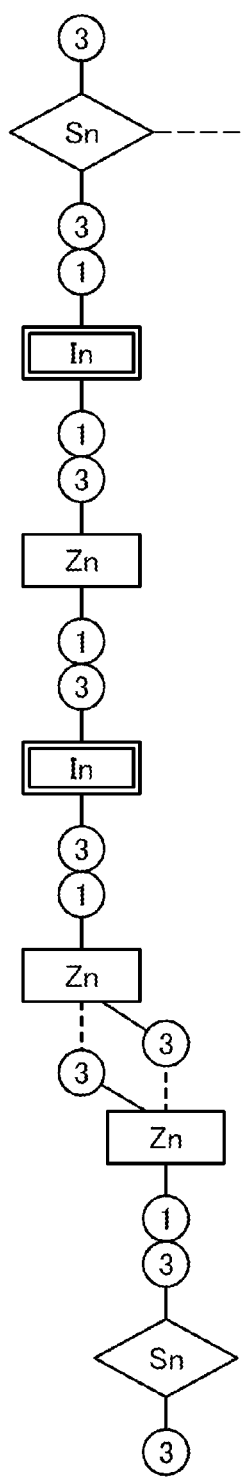
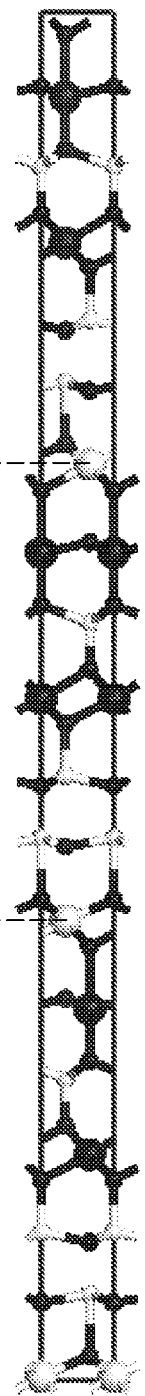
● In
○ Sn
◇ Zn
• O

● In
● Ga
● Zn
● O

MEMORY DEVICE AND SEMICONDUCTOR DEVICE

BACKGROUND OF THE INVENTION

1. Field of the Invention

The present invention relates to a memory device and a semiconductor device including the memory device.

2. Description of the Related Art

Semiconductor devices such as central processing units (CPUs) have a variety of configurations depending on the application and are generally provided with buffer memory devices capable of high-speed writing and reading of data, such as a register and a cache, as well as a main memory device for storing data or an instruction. A buffer memory device is provided in a CPU so as to be located between an arithmetic unit and a main memory device for the purpose of reducing access to the low-speed main memory device and speeding up the arithmetic processing.

In general, a flip-flop is used as a register, and a static random access memory (SRAM) is used as a cache. Patent Document 1 shown below discloses a configuration in which a volatile memory such as an SRAM and a nonvolatile memory are used in combination as a cache.

REFERENCE

Patent Document

[Patent Document 1] Japanese Published Patent Application No. H7-121444

SUMMARY OF THE INVENTION

A semiconductor device such as a central processing unit is required to have low power consumption and a high integration degree in addition to high-speed operation. Although it depends on the size of a transistor, for example, when a p-channel transistor and an n-channel transistor which are connected in series between a node supplied with a high-level power supply potential and a node supplied with a low-level power supply potential are formed using bulk silicon, an off-state current of approximately 1 pA is generated at room temperature under a condition where voltage between the nodes is approximately 3 V. As the size of a central processing unit or a buffer memory device becomes larger and the number of transistors becomes larger, or as the temperature of an IC chip including the central processing unit or the buffer memory device becomes higher, the total amount of the off-state current becomes larger; accordingly, power consumption is increased.

In order to reduce power consumption of a semiconductor device, a method in which the supply of power to a buffer memory device is stopped has been proposed. Since a flip-flop or an SRAM which is used for the buffer memory device is volatile, in the above method, a nonvolatile memory device is provided around the volatile memory device and data is temporarily transferred to the nonvolatile memory device before the supply of power is stopped. However, since such a nonvolatile memory device is mainly formed using a magnetic element or a ferroelectric memory, the manufacturing process is complex.

When the supply of power supply voltage is stopped for a long period, a method in which data is transferred to an external memory device such as a hard disk or a flash memory before the supply of power supply voltage is stopped can be employed. However, it takes a long time to transfer the data from the external memory device back to the buffer memory device; thus, this method is not suitable for the case where the supply of power supply voltage is stopped for a short period.

In view of the above technical background, it is an object of an embodiment of the present invention to provide a memory device in which power consumption can be suppressed and a semiconductor device including the memory device.

In order to achieve the above object, in an embodiment of the present invention, a memory device includes a memory element including a plurality of logic elements each of which generates an output potential by inverting a polarity of an input potential, a capacitor which stores data of the memory element, and a switching element which controls supply of electric charge to the capacitor, holding of electric charge in the capacitor, and release of electric charge from the capacitor.

In an embodiment of the present invention, data held in the memory element is saved in the capacitor before supply of power supply voltage to the memory device is stopped. Specifically, data is saved by supply of electric charge to the capacitor, and the electric charge is held by turning off the switching element. Then, after the supply of power supply voltage to the memory device is started again, the electric charge held in the capacitor is released, so that the data saved is returned to the memory element. With the above configuration, even when the supply of power supply voltage is stopped, data in the memory device can be prevented from being lost. Accordingly, it is not necessary to save data in the external memory device, so that the supply of power supply voltage to the memory device or the semiconductor device including the memory device can be stopped even for a short time. As a result, power consumption of the memory device and the semiconductor device can be reduced.

In an embodiment of the present invention, among the plurality of logic elements included in the memory element, a logic element (a first logic element) which controls input of data to the memory element inverts a polarity of an input potential in accordance with a first clock signal. Among the plurality of logic elements, some logic elements have a function of holding data which is input. At least one logic element (a second logic element) among the some logic elements inverts a polarity of an input potential in accordance with a second clock signal.

The first clock signal and the second clock signal are different types of signals. Thus, a polarity of a potential of the first clock signal and a polarity of a potential of the second clock signal can be inverted at different timings. Accordingly, in an embodiment of the present invention, a state in which one of the first and second logic elements is on and the other is off can be made, or a state in which both of them are off can be made.

In an embodiment of the present invention, by tuning on one of the first and second logic elements and turning off the other, writing of data to the memory element and holding of the data in the memory element can be performed sequentially. In addition, in an embodiment of the present invention, both the first logic element and the second logic element can be turned off when data saved in the capacitor is returned to the memory element; thus, the reliability of data output from the memory element can be improved.

Specifically, a memory device according to an embodiment of the present invention includes a first logic element which generates an output potential by inverting a polarity of a potential of a signal including data in accordance with a first clock signal; a second logic element and a third logic element which hold the output potential generated by the first logic element; a switching element including a transistor; and a capacitor which stores the data by being supplied with the output potential of the first logic element which is held by the second logic element and the third logic element via the switching element. The second logic element generates an output potential of the second logic element by inverting a polarity of an output potential of the third logic element in accordance with a second clock signal which is different from the first clock signal, and the third logic element generates the output potential of the third logic element by inverting a polarity of the output potential of the second logic element.

In an embodiment of the present invention, with the above configuration, it is possible to provide a memory device in which power consumption can be suppressed and a semiconductor device including the memory device.

BRIEF DESCRIPTION OF THE DRAWINGS

FIGS. 6A to 6C illustrate a logic symbol, a truth table, and the configuration of a logic element, respectively.
FIGS. 19A to 19C show a crystal structure of an oxide semiconductor.

DETAILED DESCRIPTION OF THE INVENTION

Hereinafter, embodiments of the present invention will be described in detail with reference to the accompanying drawings. However, the present invention is not limited to the following description and it is easily understood by those skilled in the art that the modes and details thereof can be variously changed without departing from the spirit and the scope of the present invention. Accordingly, the present invention should not be construed as being limited to the description of the embodiments below.

The present invention includes in its category the following semiconductor devices in which a memory device can be used: integrated circuits such as microprocessors, image processing circuits, digital signal processors (DSPs), and microcontrollers, RF tags, and semiconductor display devices. The semiconductor display devices include the following in its category: liquid crystal display devices, light-emitting devices in which a light-emitting element typified by an organic light-emitting element (OLED) is provided for each pixel, electronic paper, digital micromirror devices (DMDs), plasma display panels (PDPs), field emission displays (FEDs), and other semiconductor display devices in which a memory device is included in a driver circuit or a control circuit.

(Embodiment 1)

Figure 1A:
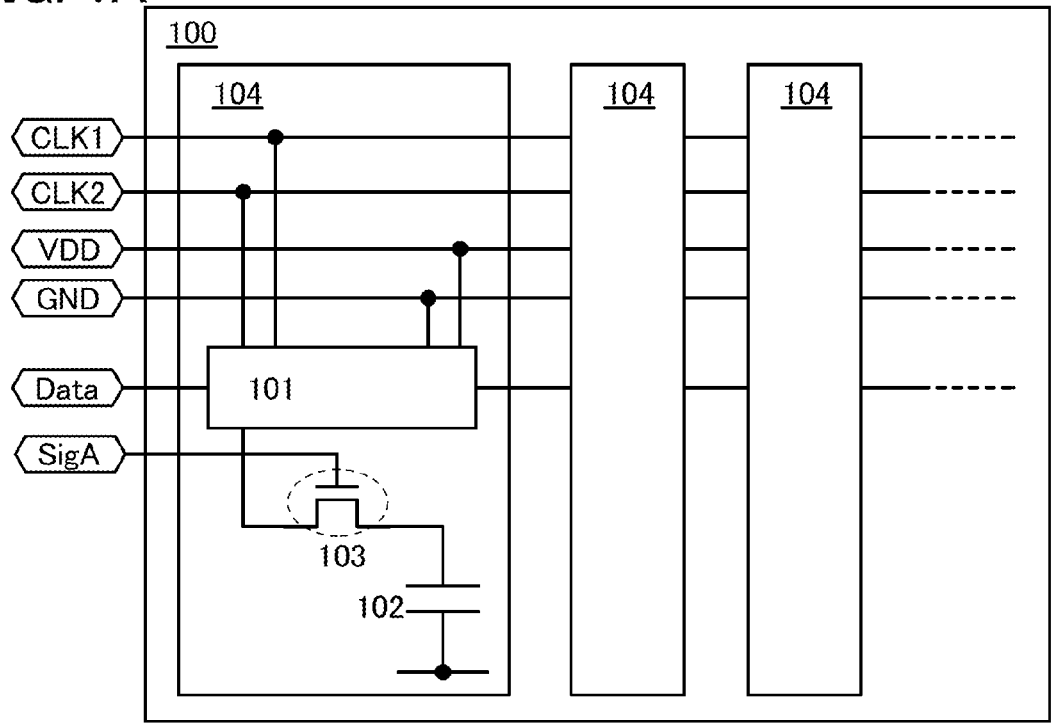
FIGS. 1A and 1B illustrate the configurations of a memory device and a unit memory circuit, respectively.

FIG. 1A shows a configuration example of a memory device according to an embodiment of the present invention. A memory device 100 according to an embodiment of the present invention includes at least one unit memory circuit 104 capable of storing one-bit data. FIG. 1A shows an example in which the memory device 100 includes a plurality of unit memory circuits 104. In the memory device 100, a potential output from any one of the unit memory circuits 104 is input to a unit memory circuit 104 in the subsequent stage.

The unit memory circuit 104 includes a memory element 101, a capacitor 102 which stores data of the memory element 101, and a switching element 103 which controls supply of electric charge to the capacitor 102, holding of electric charge in the capacitor 102, and release of electric charge from the capacitor 102. The unit memory circuit 104 may further include another circuit element such as a diode, a resistor, or an inductor, as needed.

The memory element 101 includes a plurality of logic elements each of which generates an output potential by inverting a polarity of an input potential. A reference potential GND and a high-level power supply potential VDD can be supplied to the plurality of logic elements. When the reference potential GND and the power supply potential VDD are supplied to the logic elements, a potential difference between the reference potential GND and the power supply potential VDD is supplied to the logic elements as power supply voltage.

At least two of the plurality of logic elements invert polarities of input potentials in accordance with a first clock signal CLK1 and a second clock signal CLK2.

The memory element 101 stores data included in a signal Data which is input. Specifically, when one-bit data included in the signal Data is input to the unit memory circuit 104 in the first stage, the data is input to the memory element 101. The memory element 101 holds the data as long as the reference potential GND, the power supply potential VDD, the first clock signal CLK1, and the second clock signal CLK2 are supplied to the memory element 101. Then, when the one-bit data is input to the unit memory circuit 104 in the subsequent stage, next one-bit data included in the signal Data is input to the unit memory circuit 104 in the first stage. By repeating the above operation, all bits of data included in the signal Data are held by the plurality of unit memory circuits 104.

The capacitor 102 is connected to the memory element 101 via the switching element 103 so as to store data of the signal Data input to the unit memory circuit 104 as necessary. Specifically, the capacitor 102 includes a dielectric between a pair of electrodes. One of the electrodes is connected to the memory element 101 via the switching element 103, and the other of the electrodes is connected to a node to which a reference potential GND or the like is supplied. The switching of the switching element 103 is controlled by a signal Sig A supplied to a gate electrode thereof.

Note that FIG. 1A illustrates an example in which the switching element 103 includes one transistor, but the present invention is not limited to this configuration. In an embodiment of the present invention, a plurality of transistors may be used to form the switching element 103. In the case where the switching element 103 includes a plurality of transistors, the plurality of transistors may be connected to each other in parallel, in series, or in combination of parallel connection and series connection.

In this specification, a state in which transistors are connected to each other in series means a state in which only one of a source and a drain of a first transistor is connected to only one of a source and a drain of a second transistor. In addition, a state in which transistors are connected to each other in parallel means a state in which one of a source and a drain of a first transistor is connected to one of a source and a drain of a second transistor and the other of the source and the drain of the first transistor is connected to the other of the source and the drain of the second transistor.

Note that the terms "source" and "drain" of a transistor interchange with each other depending on the polarity of the transistor or levels of potentials supplied to the source and the drain. In general, as for a source and a drain in an n-channel transistor, one to which a lower potential is supplied is called a source, and one to which a higher potential is supplied is called a drain. Further, as for a source and a drain in a p-channel transistor, one to which a lower potential is supplied is called a drain, and one to which a higher potential is supplied is called a source. In this specification, although connection relation of the transistor is described assuming that the source and the drain are fixed in some cases for convenience, actually, the names of the source and the drain interchange with each other depending on the relation of the potentials.

Although FIG. 1A illustrates the example of the case where the transistor included in the switching element 103 has a single-gate structure, the transistor may have a multi-gate structure in which a plurality of electrically connected gate electrodes are included so that a plurality of channel formation regions are included.

Figure 1B:
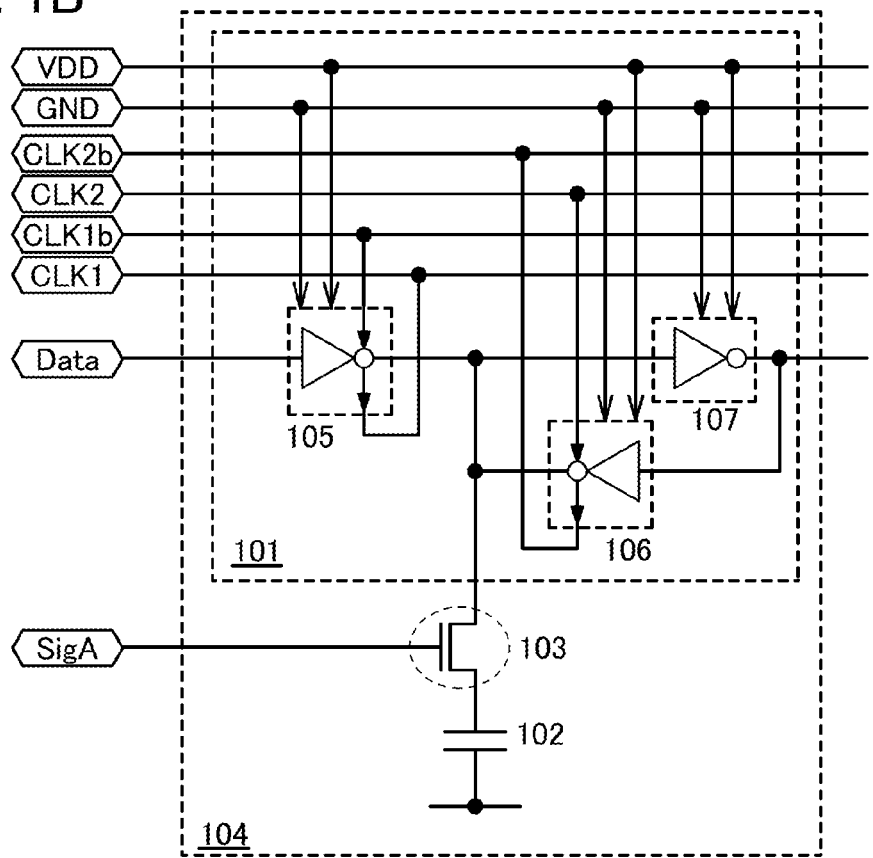

FIG. 1B shows a specific configuration example of the unit memory circuit 104. In the unit memory circuit 104 shown in FIG. 1B, the memory element 101 includes a first logic element 105, a second logic element 106, and a third logic element 107. The first logic element 105 inverts a polarity of an input potential in accordance with the first clock signal CLK1. The second logic element 106 inverts a polarity of an input potential in accordance with the second clock signal CLK2. The third logic element 107 inverts a polarity of an input potential.

The first logic element 105, the second logic element 106, and the third logic element 107 are each connected to a node to which the reference potential GND is supplied and a node to which the power supply potential VDD is supplied. The first logic element 105 operates and generates an output potential as long as the first clock signal CLK1, the reference potential GND, and the power supply potential VDD are supplied to the first logic element 105. The second logic element 106 operates and generates an output potential as long as the second clock signal CLK2, the reference potential GND, and the power supply potential VDD are supplied to the second logic element 106. The third logic element 107 operates and generates an output potential as long as the reference potential GND and the power supply potential VDD are supplied to the third logic element 107.

In FIG. 1B, not only the first clock signal CLK1 but also a first clock signal CLK1b obtained by inverting a polarity of a potential of the first clock signal CLK1 is input to the first logic element 105. The first clock signal CLK1 and the first clock signal CLK1b are regarded as the same type of signal in an embodiment of the present invention because polarities of potentials thereof are inverted at substantially the same timing. Similarly, in FIG. 1B, not only the second clock signal CLK2 but also a second clock signal CLK2b obtained by inverting a polarity of a potential of the second clock signal CLK2 is input to the second logic element 106. The second clock signal CLK2 and the second clock signal CLK2b are regarded as the same type of signal because polarities of potentials thereof are inverted at substantially the same timing.

Hereinafter, specific configurations and operations of the first logic element 105 and the second logic element 106 are described. FIG. 6A shows a logic symbol of each of the first logic element 105 and the second logic element 106. In FIG. 6A, an input potential is supplied to a terminal A. The potential of the first clock signal CLK1b or the second clock signal CLK2 is supplied to a terminal $\phi$. The potential of the first clock signal CLK1 or the second clock signal CLK2b is supplied to a terminal $\phi b$. An output potential is output from a terminal X.

FIG. 6B is a truth table showing levels of potentials supplied to terminals of the first logic element 105 and the second logic element 106, and levels of output potentials.

As shown in FIG. 6B, when a high-level potential is supplied to the terminal $\phi$ and a low-level potential is supplied the terminal $\phi b$, the first logic element 105 and the second logic element 106 each invert a polarity of an input potential supplied to the terminal A to generate an output potential. When the potential of the terminal A is at a high level, the potential of the terminal X is at a low level; on the other hand, when the potential of the terminal A is at a low level, the potential of the terminal X is at a high level.

In addition, as shown in FIG. 6B, when a low-level potential is supplied to the terminal $\phi$ and a high-level potential is supplied the terminal $\phi b$, the first logic element 105 and the second logic element 106 are each in a high impedance state, that is, an off state.

FIG. 6C shows a circuit configuration example of each of the first logic element 105 and the second logic element 106. The logic element shown in FIG. 6C includes a p-channel transistor 110, a p-channel transistor 111, an n-channel transistor 112, and an n-channel transistor 113 which are sequentially connected in series. Specifically, a source of the p-channel transistor 110 is connected to a node to which the power supply potential VDD is supplied, and a drain of the p-channel transistor 110 is connected to a source of the p-channel transistor 111. A source of the n-channel transistor 113 is connected to a node to which the reference potential GND is supplied, and a drain of the n-channel transistor 113 is connected to a source of the n-channel transistor 112. A drain of the p-channel transistor 111 and a drain of the n-channel transistor 112 are connected to each other.

A gate of the p-channel transistor 110 corresponds to the terminal $\phi b$, and a gate of the n-channel transistor 113 corresponds to the terminal $\phi$. A gate of the p-channel transistor 111 and a gate of the n-channel transistor 112 correspond to the terminal A to which the input potential is supplied. The drain of the p-channel transistor 111 and the drain of the n-channel transistor 112 correspond to the terminal X whose potential is the output potential.

An example of a specific operation of the unit memory circuit 104 shown in FIG. 1B is described in detail with reference to FIG. 2, FIGS. 3A and 3B, FIGS. 4A and 4B, and FIG. 5.

Figure 2:
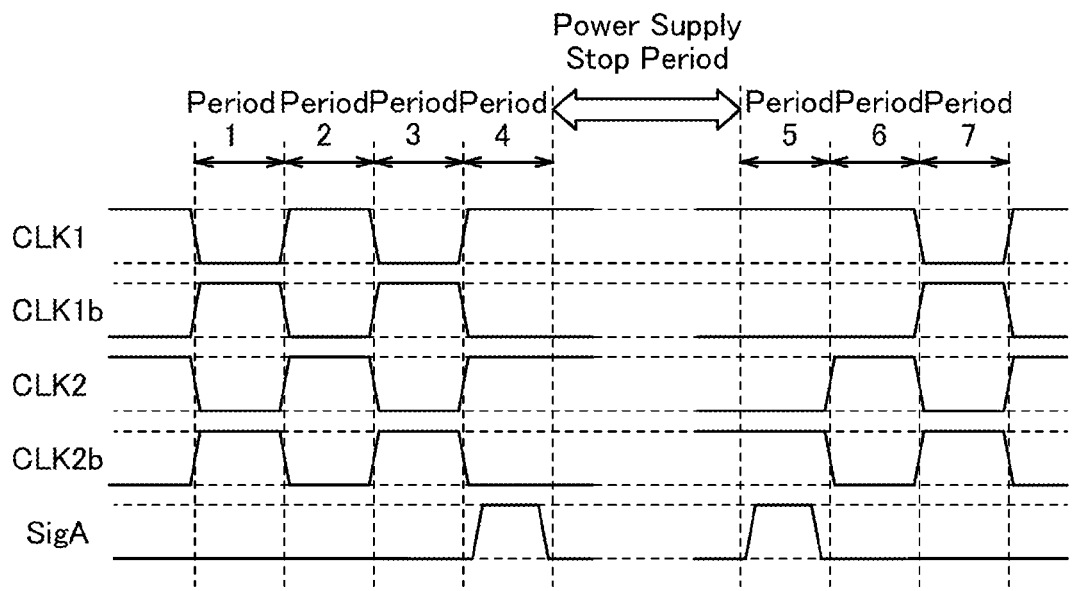
FIG. 2 is a timing chart.

FIG. 2 is a timing chart showing changes over time in potentials of the first clock signal CLK1, the first clock signal CLK1b, the second clock signal CLK2, the second clock signal CLK2b, and the signal Sig A in the unit memory circuit 104 shown in FIG. 1B. Power supply voltage is supplied to the unit memory circuit 104 in periods 1 to 4 and periods 5 to 7.

In the period 1 in FIG. 2, the potential of the first clock signal CLK1 is at a low level, the potential of the first clock signal CLK1b is at a high level, the potential of the second clock signal CLK2 is at a low level, the potential of the second clock signal CLK2b is at a high level, and the potential of the signal Sig A is at a low level.

Figure 3A:
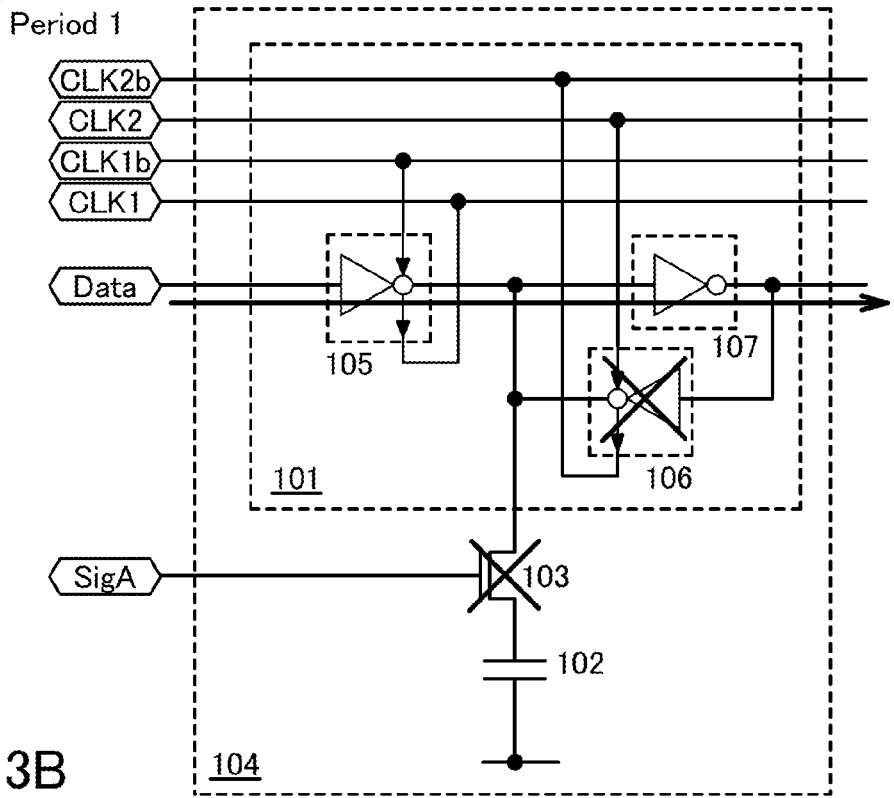
FIGS. 3A and 3B illustrate the operation of a unit memory circuit.

FIG. 3A schematically shows the operation of the unit memory circuit 104 in the period 1. In the period 1, in the unit memory circuit 104, the first logic element 105 is turned on, the second logic element 106 is turned off, the third logic element 107 is turned on, and the switching element 103 is turned off in accordance with the potentials of the above signals. Thus, when the potential of the signal Data is supplied, the first logic element 105 inverts a polarity of the potential of the signal Data to generate an output potential. Then, when the output potential of the first logic element 105 is supplied to the third logic element 107, the third logic element 107 inverts a polarity of the output potential of the first logic element 105 to generate an output potential.

In the period 2 in FIG. 2, the potential of the first clock signal CLK1 is at a high level, the potential of the first clock signal CLK1b is at a low level, the potential of the second clock signal CLK2 is at a high level, the potential of the second clock signal CLK2b is at a low level, and the potential of the signal Sig A is at a low level.

Figure 3B:
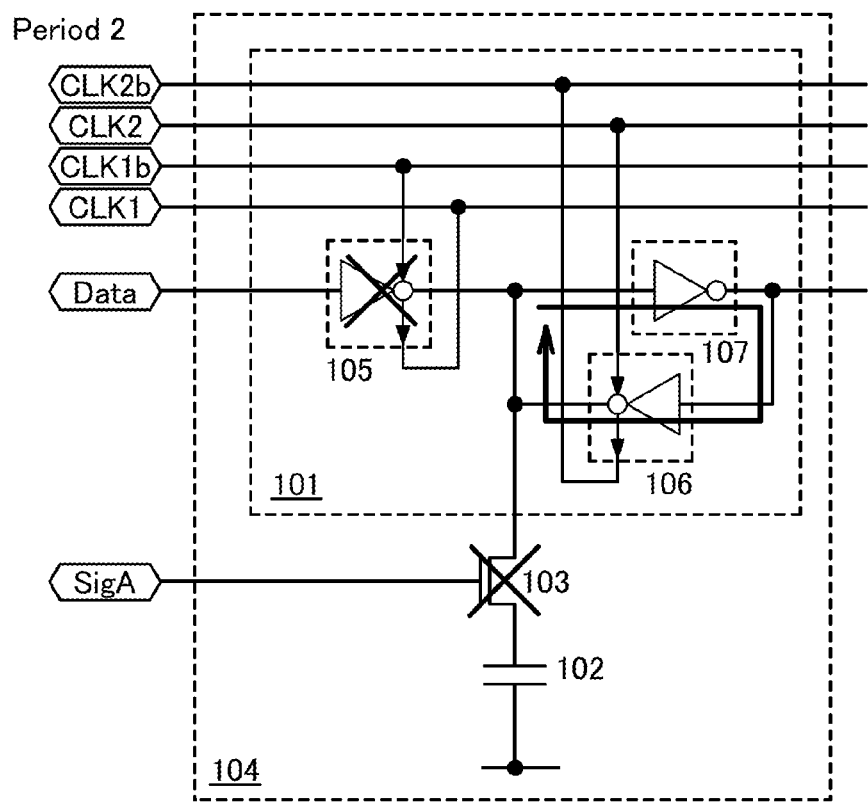

FIG. 3B schematically shows the operation of the unit memory circuit 104 in the period 2. In the period 2, in the unit memory circuit 104, the first logic element 105 is turned off, the second logic element 106 is turned on, the third logic element 107 is turned on, and the switching element 103 is turned off in accordance with the potentials of the above signals. Thus, the third logic element 107 inverts the polarity of the output potential of the first logic element 105 which is generated in the period 1 to generate an output potential. When the output potential of the third logic element 107 is supplied, the second logic element 106 inverts the polarity of the potential of the third logic element 107 to generate an output potential. Then, when the output potential of the second logic element 106 is supplied to the third logic element 107, the third logic element 107 inverts the polarity of the output potential of the second logic element 106 to generate an output potential. By repeating the above operation, the output potential of the first logic element 105 which is generated in the period 1 is held by the second logic element 106 and the third logic element 107.

Then, in the period 3 in FIG. 2, the unit memory circuit 104 operates as in the period 1.

In the period 4 in FIG. 2, the potential of the first clock signal CLK1 is at a high level, the potential of the first clock signal CLK1b is at a low level, the potential of the second clock signal CLK2 is at a high level, the potential of the second clock signal CLK2b is at a low level, and the potential of the signal Sig A is at a high level.

Figure 4A:
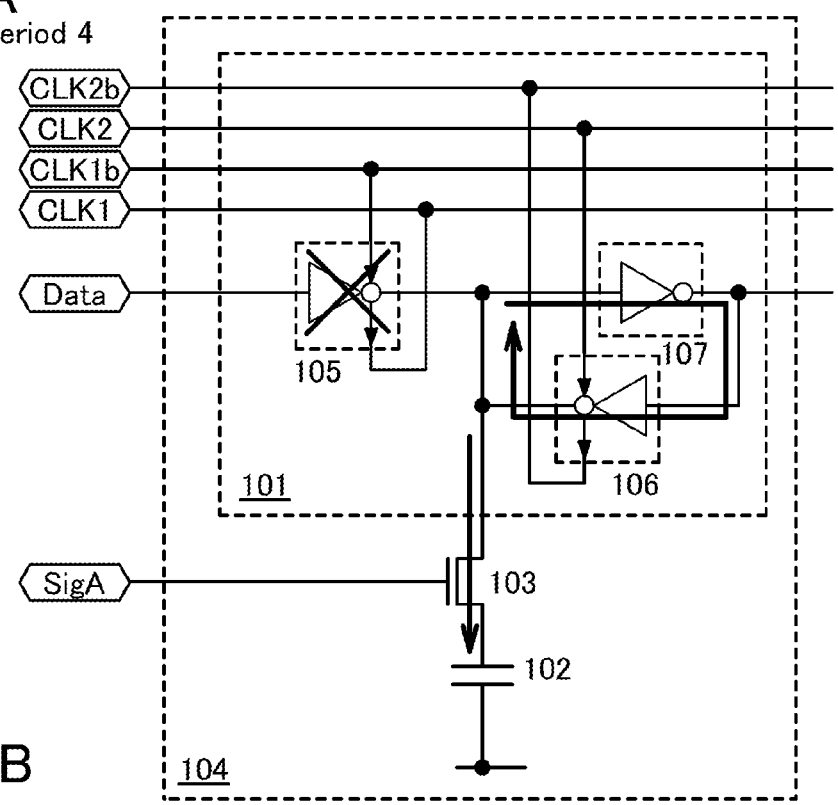
FIGS. 4A and 4B illustrate the operation of a unit memory circuit.

FIG. 4A schematically shows the operation of the unit memory circuit 104 in the period 4. In the period 4, in the unit memory circuit 104, the first logic element 105 is turned off, the second logic element 106 is turned on, the third logic element 107 is turned on, and the switching element 103 is turned on in accordance with the potentials of the above signals. As in the case of the period 2, the output potential of the first logic element 105 which is generated in the period 3 is held by the second logic element 106 and the third logic element 107.

However, unlike in the period 2, the switching element 103 is turned on in the period 4. Thus, the output potential of the second logic element 106, that is, the output potential of the first logic element 105 in the period 3 is supplied to the capacitor 102 via the switching element 103 that is on. Electric charge is supplied to the capacitor 102 in accordance with the potential supplied thereto. After that, the switching element 103 is turned off, so that the electric charge supplied to the capacitor 102 is held. With the above configuration, data held in the memory element 101 can be saved in the capacitor 102.

After the period 4 is finished, supply of power supply voltage to the memory device 100 can be stopped. In FIG. 2, a period during which supply of power supply voltage to the memory device 100 is stopped is denoted by a power supply stop period. Specifically, the stop of supply of power supply voltage means that a difference between the potential of the node to which the power supply potential VDD is supplied and the potential of the node to which the reference potential GND is supplied is made to be as close to zero as possible. In the power supply stop period, supply of the first clock signal CLK1 and the first clock signal CLK1b to the first logic element 105 can also be stopped. In addition, in the power supply stop period, supply of the second clock signal CLK2 and the second clock signal CLK2b to the second logic element 106 can also be stopped.

In the power supply stop period, data is held in the capacitor 102, and it is not necessary to supply power supply voltage to the memory element 101. Thus, power that might be consumed owing to an off-state current flowing through the first logic element 105, the second logic element 106, and the third logic element 107 by supplying the power supply voltage to the memory element 101 can be substantially 0 during the power supply stop period. As a result, the power consumption due to the off-state current can be significantly reduced, and the power consumption of the memory device 100 and further the whole semiconductor device including the memory device 100 can be suppressed to low.

Although data is saved in the period 4 in this embodiment, data may be saved in the period 3 and the power supply stop period may be provided after the period 3 is finished.

When the power supply stop period is finished and the period 5 is started, supply of the power supply voltage to the memory device 100 is started again. In the period 5 in FIG. 2, the potential of the first clock signal CLK1 is at a high level, the potential of the first clock signal CLK1b is at a low level, the potential of the second clock signal CLK2 is at a low level, the potential of the second clock signal CLK2b is at a high level, and the potential of the signal Sig A is at a high level.

Figure 4B:
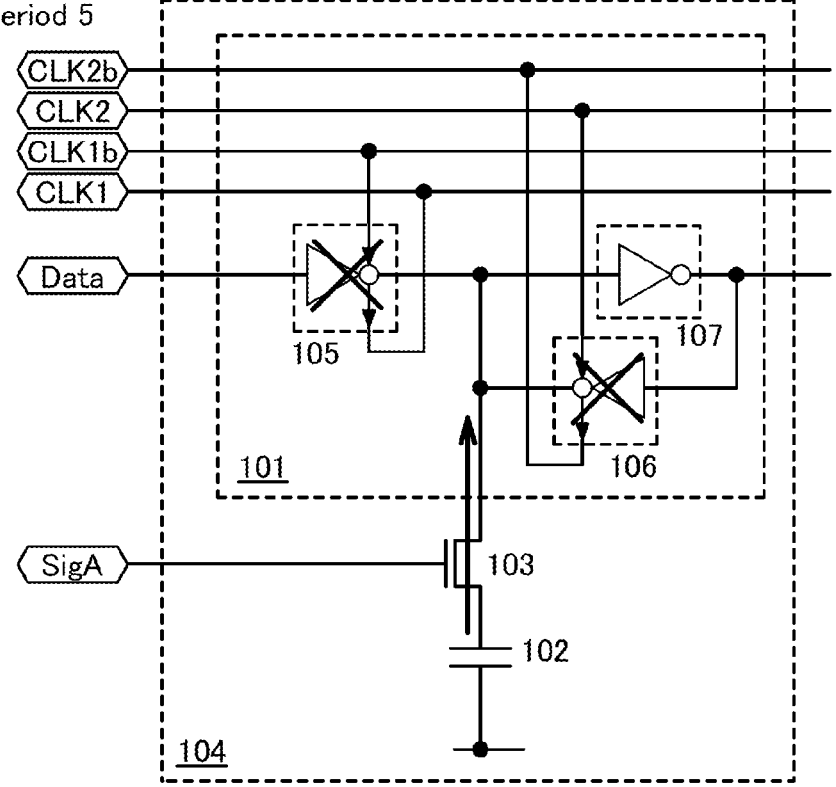

FIG. 4B schematically shows the operation of the unit memory circuit 104 in the period 5. In the period 5, in the unit memory circuit 104, the first logic element 105 is turned off, the second logic element 106 is turned off, the third logic element 107 is turned on, and the switching element 103 is turned on in accordance with the potentials of the above signals. Accordingly, the electric charge held in the capacitor 102 is supplied to the memory element 101 via the switching element 103 that is on. The amount of the held electric charge depends on the output potential of the second logic element 106 in the period 4, that is, the output potential of the first logic element 105 in the period 3. When the electric charge is supplied to the memory element 101, the output potential of the second logic element 106 in the period 4, that is, the output potential of the first logic element 105 in the period 3 can be supplied to the third logic element 107. Then, the switching element 103 is turned off, so that the potential supplied to the third logic element 107 is held. With the above configuration, data saved in the capacitor 102 can be returned to the memory element 101.

Next, in the period 6 in FIG. 2, the potential of the first clock signal CLK1 is at a high level, the potential of the first clock signal CLK1b is at a low level, the potential of the second clock signal CLK2 is at a high level, the potential of the second clock signal CLK2b is at a low level, and the potential of the potential of signal Sig A is at a low level.

Figure 5:
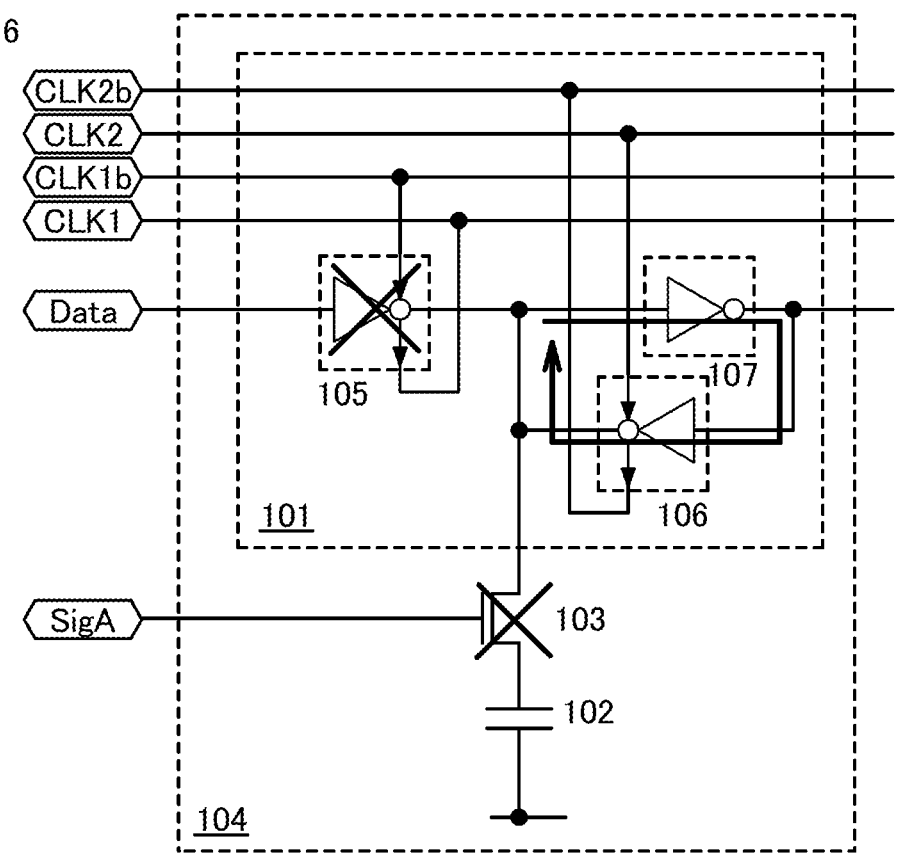
FIG. 5 illustrates the operation of a unit memory circuit.

FIG. 5 schematically shows the operation of the unit memory circuit 104 in the period 6. In the period 6, in the unit memory circuit 104, the first logic element 105 is turned off, the second logic element 106 is turned on, the third logic element 107 is turned on, and the switching element 103 is turned off in accordance with the potentials of the above signals. Thus, the third logic element 107 inverts the polarity of the potential supplied thereto in the period 5 to generate an output potential. When the output potential of the third logic element 107 is supplied, the second logic element 106 inverts the polarity of the potential of the third logic element 107 to generate an output potential. Then, when the output potential of the second logic element 106 is supplied, the third logic element 107 inverts the polarity of the output potential of the second logic element 106 to generate an output potential. By repeating the above operation, the potential that is supplied to the third logic element 107 in the period 5 is held by the second logic element 106 and the third logic element 107.

Then, in the period 7 in FIG. 2, the unit memory circuit 104 operates as in the period 1.

In an embodiment of the present invention, the first clock signals CLK1 and CLK1b and the second clock signals CLK2 and CLK2b are different types of signals. Accordingly, in an embodiment of the present invention, polarities of potentials of the first clock signals CLK1 and CLK1b and polarities of potentials of the second clock signals CLK2 and CLK2b can be inverted at different timings. Accordingly, in the periods 1 to 4 and the periods 6 and 7, a state in which one of the first logic element 105 and the second logic element 106 is on and the other is off can be made. Further, in the period 5 in which data saved in the capacitor 102 is returned to the memory element 101 after the power supply stop period is finished, both the first logic element 105 and the second logic element 106 can be turned off. With the above configuration, in an embodiment of the present invention, data can be output from the memory element 101 after data saved in the capacitor 102 is written into the memory element 101 in the period 5. Thus, even after saved data is returned to the memory element 101, the reliability of data output from the memory element 101 can be improved.

In the unit memory circuit 104 illustrated in FIG. 1B, the switching element 103 controls connection between the memory element 101 and the capacitor 102, but the present invention is not limited to this configuration. It is sufficient as long as the switching element 103 can control supply of electric charge to the capacitor 102, holding of electric charge in the capacitor 102, and release of electric charge from the capacitor 102. Specifically, the switching element 103 is needed to have a function to control flow of electric charge between the memory element 101 and the capacitor 102 so that electric charge of an amount corresponding to data held in the memory element 101 is supplied from the memory element 101 to the capacitor 102 and held in the capacitor 102, and further, the electric charge held in the capacitor 102 is released to the memory element 101.

Figure 7:
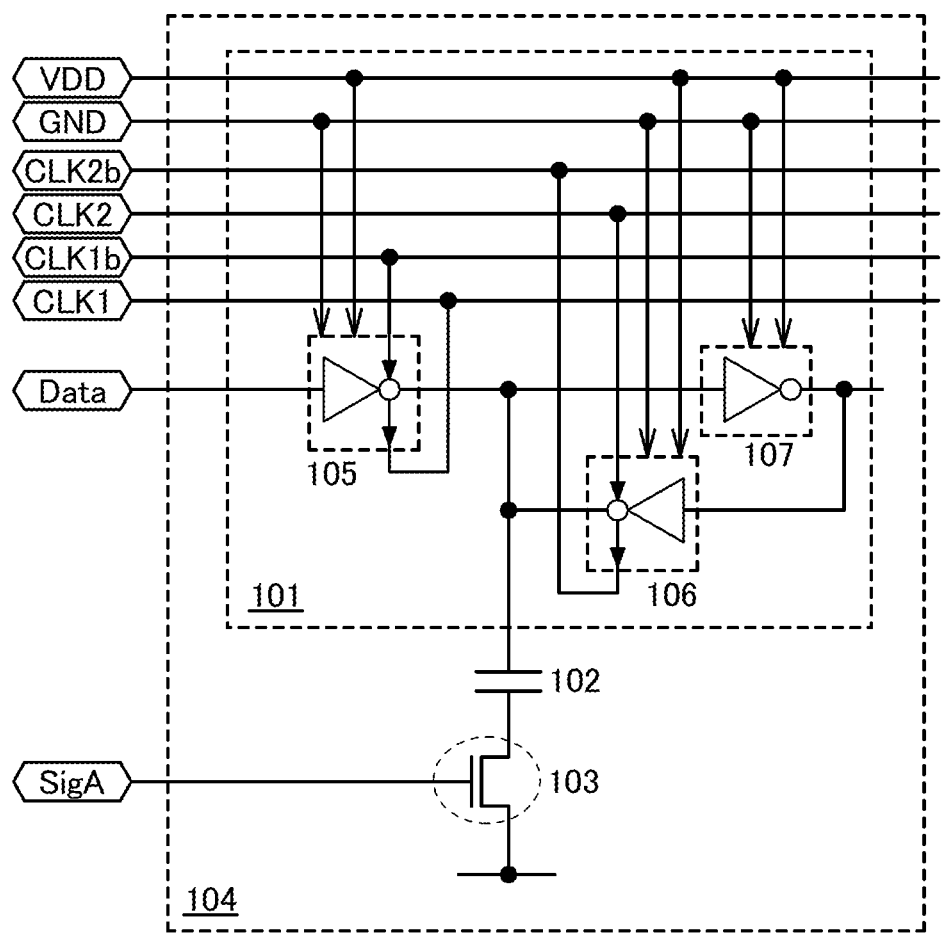
FIG. 7 illustrates the configuration of a unit memory circuit.

FIG. 7 illustrates another example of the unit memory circuit 104. In the unit memory circuit 104 illustrated in FIG. 7, the position of the switching element 103 is different from that in the unit memory circuit 104 illustrated in FIG. 1B. Specifically, one of the pair of electrodes of the capacitor 102 is connected to the memory element 101, and the other is connected to a node to which a potential such as a reference potential GND is supplied via the switching element 103.

(Embodiment 2)

In this embodiment, an example of a configuration of a memory device including a plurality of unit memory circuits and an example of an operation thereof will be described.

Figure 8:
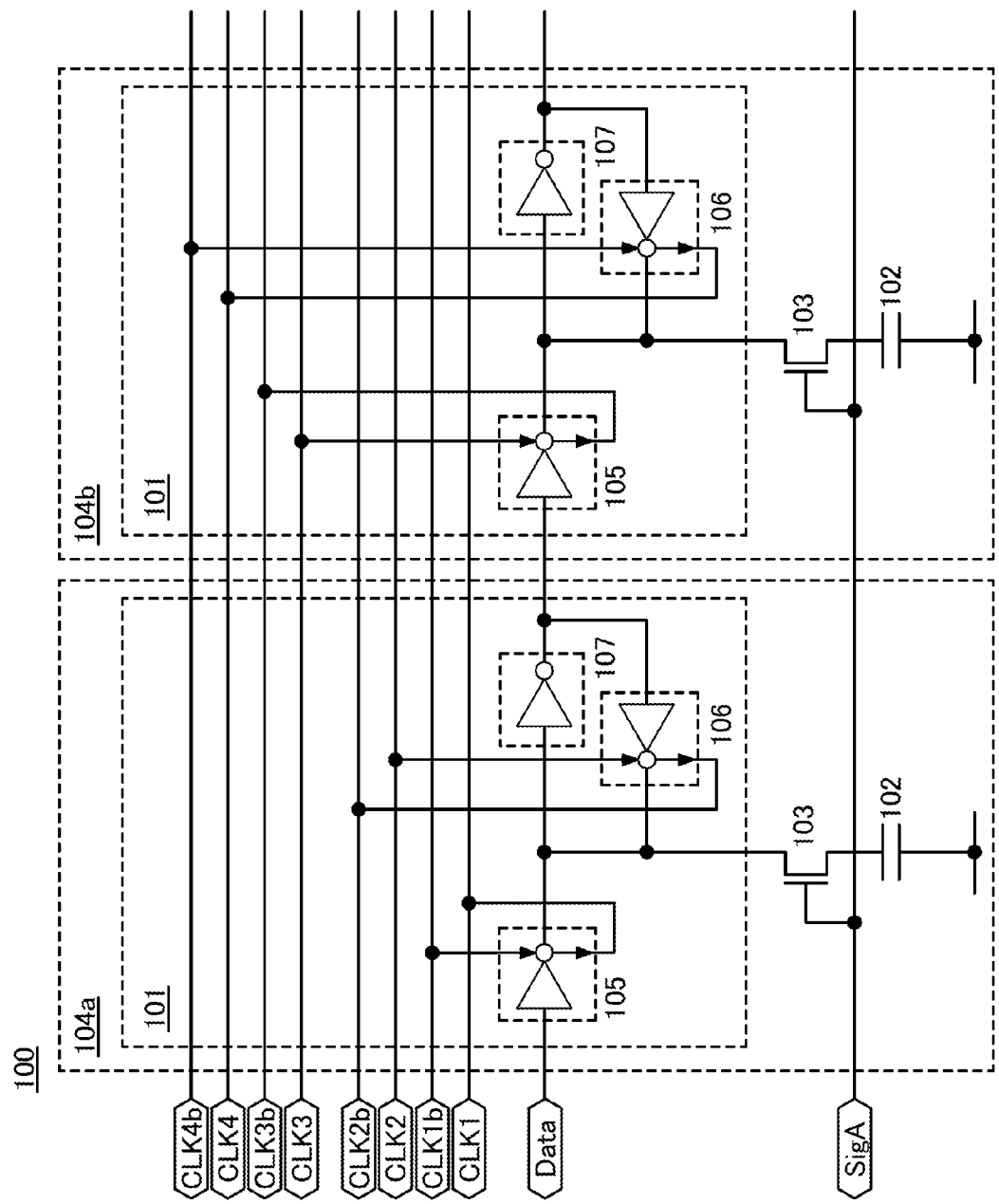
FIG. 8 illustrates the configurations of a memory device and a unit memory circuit.

FIG. 8 illustrates an example of the configuration of a memory device 100 including at least two unit memory circuits. In FIG. 8, the two unit memory circuits are a first unit memory circuit 104a and a second unit memory circuit 104b. An output potential of the first unit memory circuit 104a is supplied to the second unit memory circuit 104b.

The first unit memory circuit 104a and the second unit memory circuit 104b each have the same configuration as the unit memory circuit 104 illustrated in FIG. 1B. A first logic element 105 in the second unit memory circuit 104b inverts a polarity of an input potential in accordance with a third clock signal CLK3. A second logic element 106 in the second unit memory circuit 104b inverts a polarity of an input potential in accordance with a fourth clock signal CLK4.

The third clock signal CLK3 and the fourth clock signal CLK4 are different types of signals. Thus, a polarity of a potential of the third clock signal CLK3 and a polarity of a potential of the fourth clock signal CLK4 can be inverted at different timings. Accordingly, in an embodiment of the present invention, in each of the first unit memory circuit 104a and the second unit memory circuit 104b, a state in which one of the first logic element 105 and the second logic element 106 is on and the other is off can be made, or a state in which both of them are off can be made.

In the second unit memory circuit 104b, assuming that the first logic element 105 has the configuration illustrated in FIG. 6A, the potential of the third clock signal CLK3 is supplied to a terminal φ and a potential of a third clock signal CLK3b which is a signal obtained by inverting the polarity of the potential of the third clock signal CLK3 is supplied to a terminal φb. In the second unit memory circuit 104b, assuming that the second logic element 106 has the configuration illustrated in FIG. 6A, the potential of the fourth clock signal CLK4 is supplied to a terminal φb and a potential of a fourth clock signal CLK4b which is a signal obtained by inverting the polarity of the potential of the fourth clock signal CLK4 is supplied to a terminal φ.

The switching of a switching element 103 in the first unit memory circuit 104a and the switching of a switching element 103 in the second unit memory circuit 104b are controlled by a signal Sig A supplied to gate electrodes thereof.

Next, an example of a specific operation of the memory device 100 shown in FIG. 8 is described in detail with reference to FIG. 9, FIG. 10, FIG. 11, FIG. 12, and FIG. 13.

Figure 9:
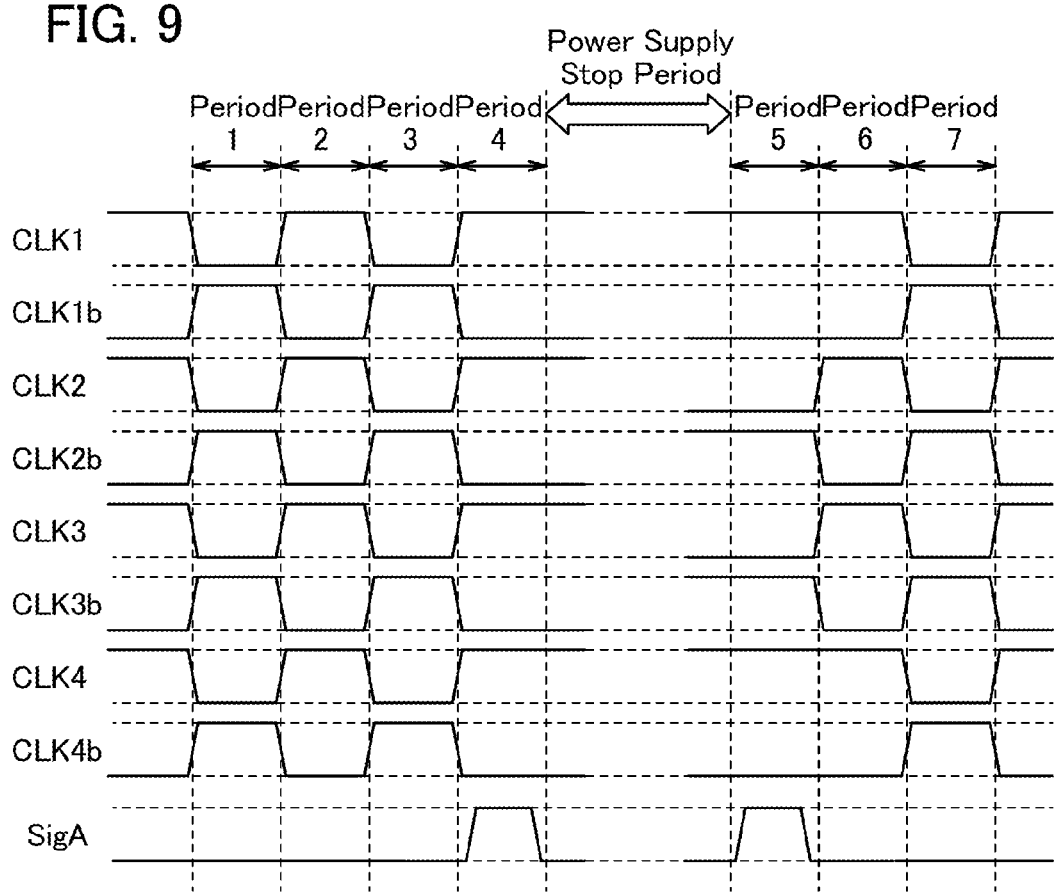
FIG. 9 is a timing chart.

FIG. 9 is a timing chart showing changes over time in potentials of signals in the memory device 100 in FIG. 8. Power supply voltage is supplied to the memory device 100 in periods 1 to 4 and periods 5 to 7.

Figure 10:
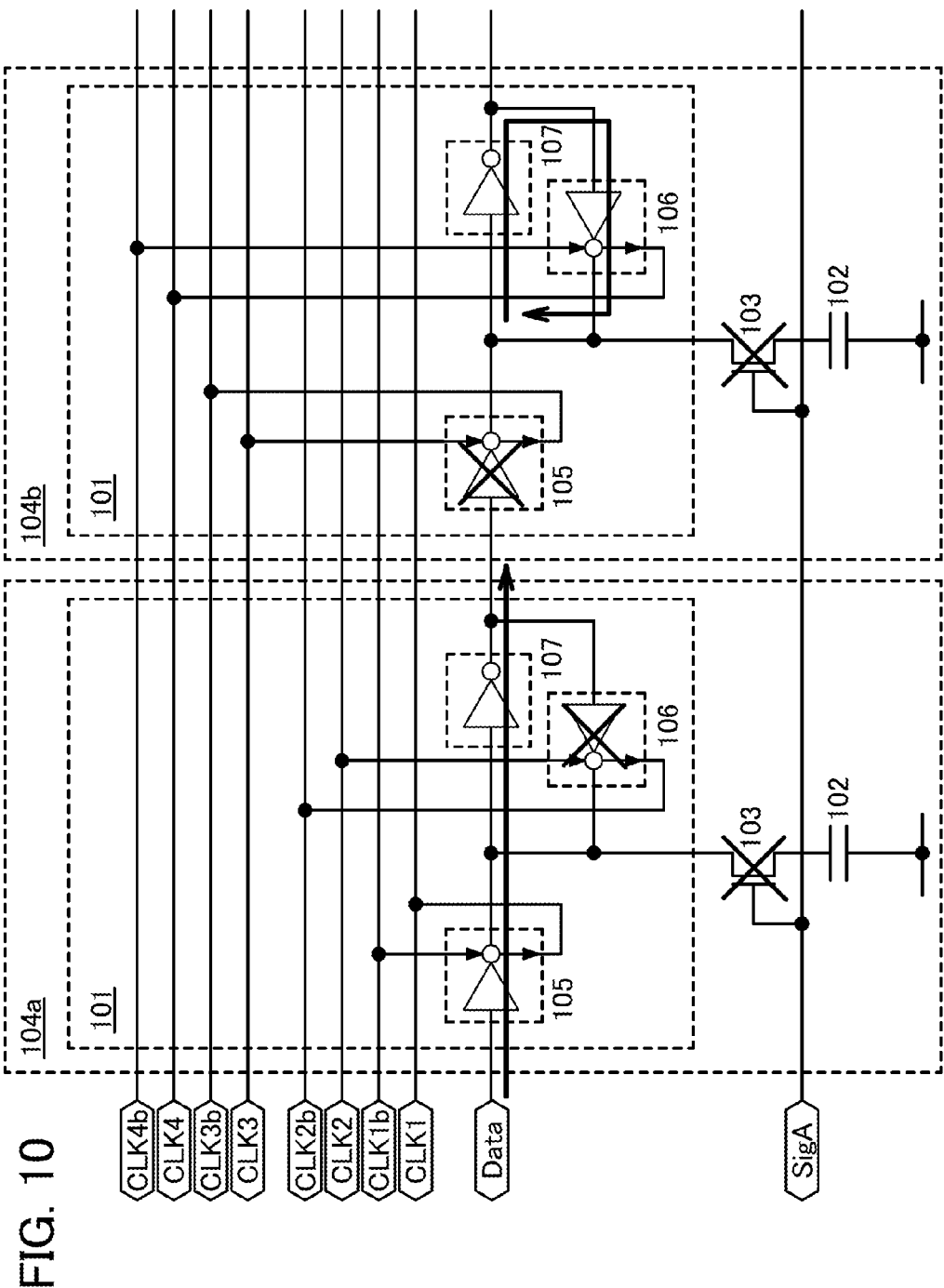
FIG. 10 illustrates the operation of a memory device.

First, in the period 1, in the first unit memory circuit 104a, the first logic element 105 is turned on, the second logic element 106 is turned off, the third logic element 107 is turned on, and the switching element 103 is turned off as illustrated in FIG. 10 in accordance with the timing chart in FIG. 9. Thus, in the first unit memory circuit 104a, a potential of a signal Data is supplied to the memory element 101 via the first logic element 105.

In addition, in the period 1, in the second unit memory circuit 104b, the first logic element 105 is turned off, the second logic element 106 is turned on, the third logic element 107 is turned on, and the switching element 103 is turned off as illustrated in FIG. 10 in accordance with the timing chart in FIG. 9. Thus, in the period 1, in the second unit memory circuit 104b, an output potential supplied from the first unit memory circuit 104a before the period 1 is held by the second logic element 106 and the third logic element 107.

Figure 11:
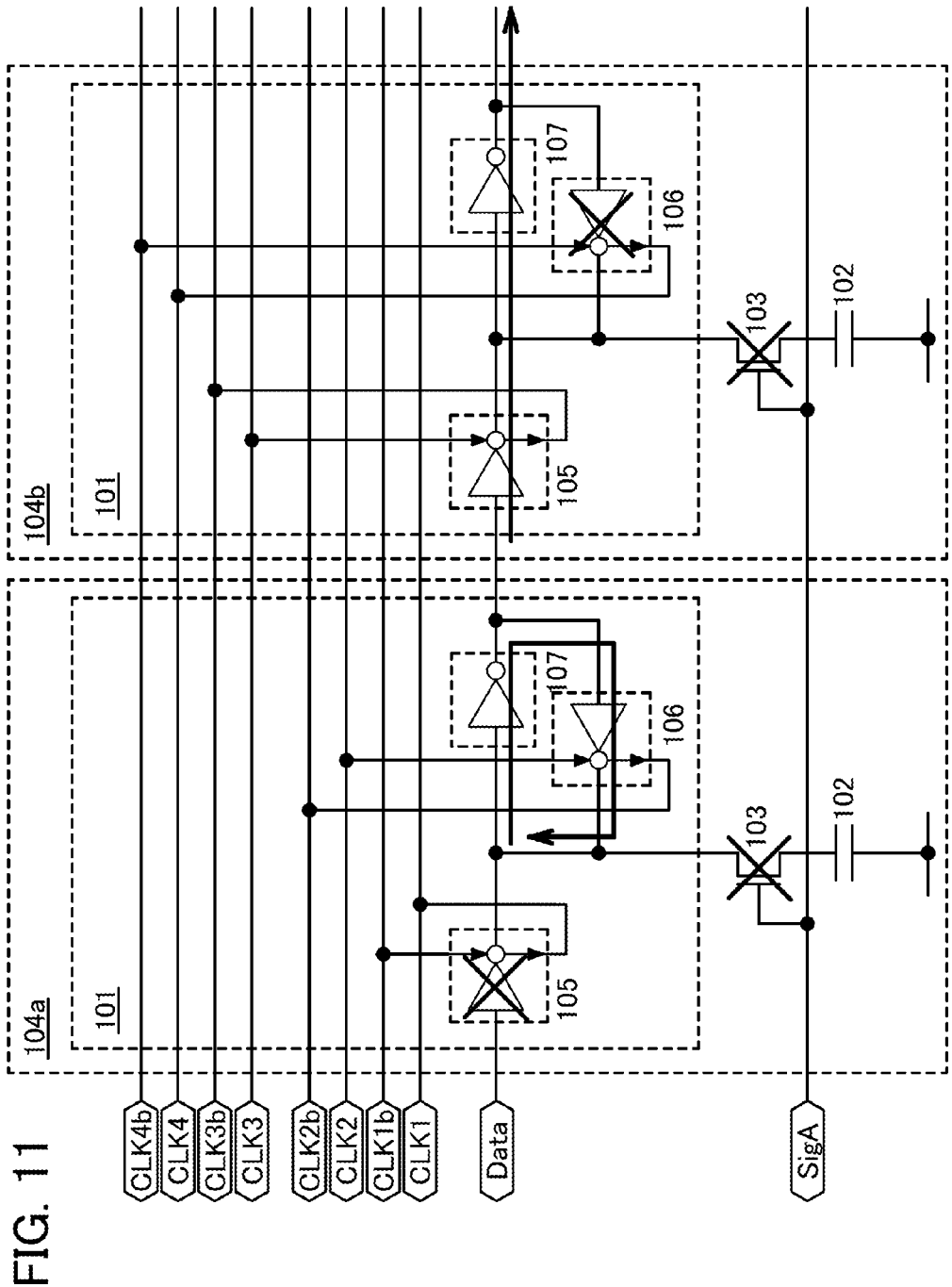
FIG. 11 illustrates the operation of a memory device.

Then, in the period 2, in the first unit memory circuit 104a, the first logic element 105 is turned off, the second logic element 106 is turned on, the third logic element 107 is turned on, and the switching element 103 is turned off as illustrated in FIG. 11 in accordance with the timing chart in FIG. 9. Thus, in the first unit memory circuit 104a, the potential of the signal Data input to the first unit memory circuit 104a in the period 1 is held by the second logic element 106 and the third logic element 107. The potential held by the second logic element 106 and the third logic element 107 is output from the first unit memory circuit 104a.

In addition, in the period 2, in the second unit memory circuit 104b, the first logic element 105 is turned on, the second logic element 106 is turned off, the third logic element 107 is turned on, and the switching element 103 is turned off as illustrated in FIG. 11 in accordance with the timing chart in FIG. 9. Thus, in the period 2, the output potential from the first unit memory circuit 104a is supplied to the second unit memory circuit 104b.

Then, in the period 3, in the first unit memory circuit 104a, the first logic element 105 is turned on, the second logic element 106 is turned off, the third logic element 107 is turned on, and the switching element 103 is turned off as illustrated in FIG. 10 in accordance with the timing chart in FIG. 9. Thus, in the first unit memory circuit 104a, the potential of the signal Data is supplied to the memory element 101 via the first logic element 105.

In addition, in the period 3, in the second unit memory circuit 104b, the first logic element 105 is turned off, the second logic element 106 is turned on, the third logic element 107 is turned on, and the switching element 103 is turned off as illustrated in FIG. 10 in accordance with the timing chart in FIG. 9. Thus, in the period 3, in the second unit memory circuit 104b, the output potential supplied from the first unit memory circuit 104a in the period 2 is held by the second logic element 106 and the third logic element 107.

Figure 12:
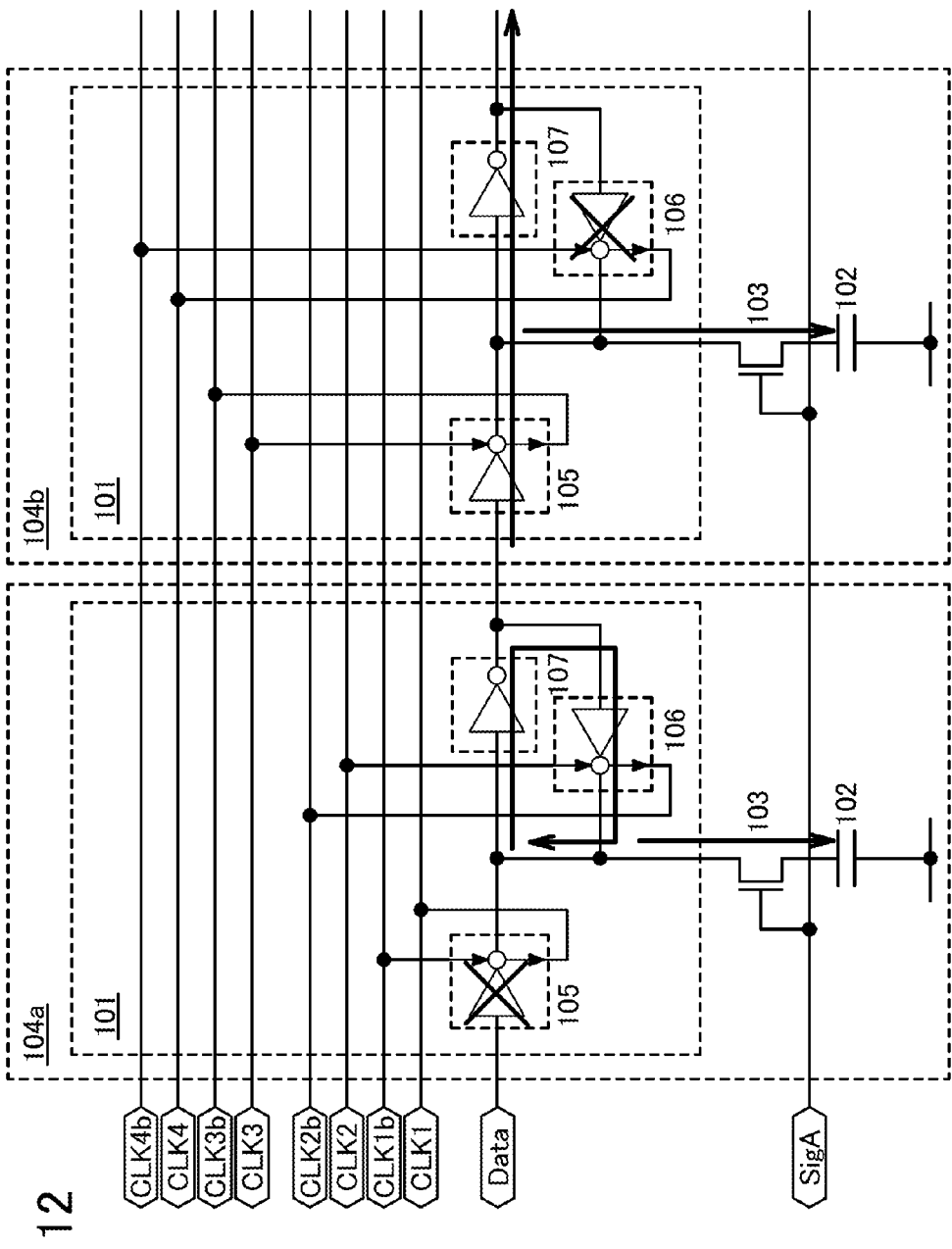
FIG. 12 illustrates the operation of a memory device.

In addition, in the period 4, in the first unit memory circuit 104a, the first logic element 105 is turned off, the second logic element 106 is turned on, the third logic element 107 is turned on, and the switching element 103 is turned on as illustrated in FIG. 12 in accordance with the timing chart in FIG. 9. Thus, in the first unit memory circuit 104a, the potential of the signal Data input to the first unit memory circuit 104a in the period 3 is held by the second logic element 106 and the third logic element 107. The potential held by the second logic element 106 and the third logic element 107 is output from the first unit memory circuit 104a.

Then, in the period 4, in the second unit memory circuit 104b, the first logic element 105 is turned on, the second logic element 106 is turned off, the third logic element 107 is turned on, and the switching element 103 is turned on as illustrated in FIG. 12 in accordance with the timing chart in FIG. 9. Thus, in the period 4, the output potential from the first unit memory circuit 104a is supplied to the second unit memory circuit 104b.

In the period 4, the switching elements 103 are turned on unlike in the period 2. Thus, in the first unit memory circuit 104a, the potential of the signal Data which is held by the second logic element 106 and the third logic element 107 is supplied to the capacitor 102 via the switching element 103 that is on. In addition, in the second unit memory circuit 104b, the output potential from the first unit memory circuit 104a is supplied to the capacitor 102 via the switching element 103 that is on. Electric charge is supplied to each capacitor 102 in accordance with the supplied potential. After that, with the switching element 103 turned off, the electric charge supplied to the capacitor 102 is held in each of the first unit memory circuit 104a and the second unit memory circuit 104b. With the above configuration, data held in the memory element 101 can be saved in the capacitor 102.

After the period 4 is finished, supply of power supply voltage to the memory device 100 can be stopped. In FIG. 9, a period during which supply of power supply voltage to the memory device 100 is stopped is denoted by a power supply stop period. In the power supply stop period, supply of the first clock signal CLK1, the first clock signal CLK1b, the second clock signal CLK2, the second clock signal CLK2b, the third clock signal CLK3, the third clock signal CLK3b, the fourth clock signal CLK4, and the fourth clock signal CLK4b to the memory device 100 can be stopped.

In the power supply stop period, data is held in the capacitor 102, and it is not necessary to supply power supply voltage to the memory element 101. Thus, power that might be consumed owing to an off-state current flowing through the first logic element 105, the second logic element 106, and the third logic element 107 by supplying the power supply voltage to the memory element 101 can be substantially 0 during the power supply stop period. As a result, the power consumption due to the off-state current can be significantly reduced, and the power consumption of the memory device 100 and further the whole semiconductor device including the memory device 100 can be suppressed to low.

When the power supply stop period is finished and the period 5 is started, supply of the power supply voltage to the memory device 100 is started again.

Figure 13:
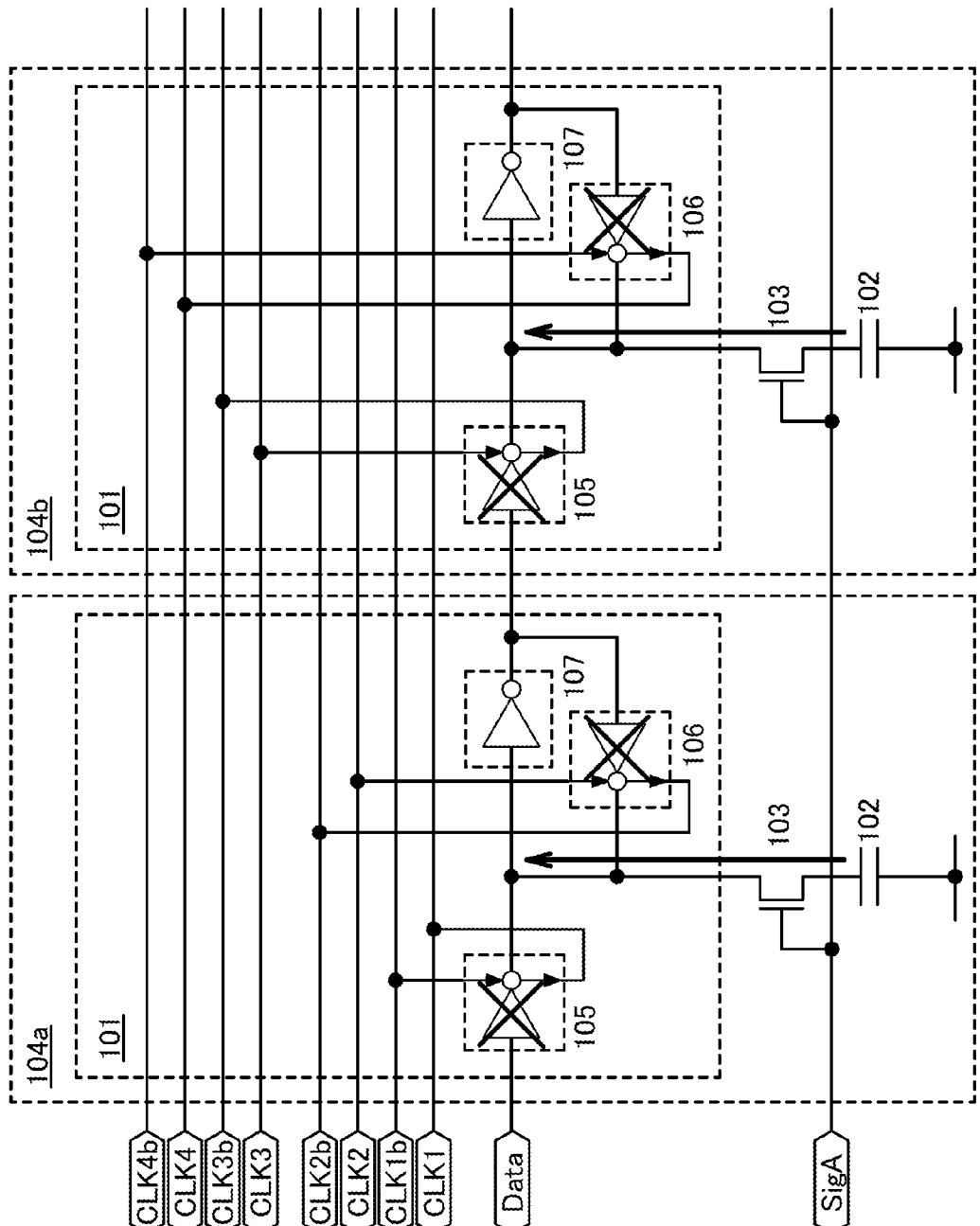
FIG. 13 illustrates the operation of a memory device.

In the period 5, in the first unit memory circuit 104a, the first logic element 105 is turned off, the second logic element 106 is turned off, the third logic element 107 is turned on, and the switching element 103 is turned on as illustrated in FIG. 13 in accordance with the timing chart in FIG. 9. In addition, in the second unit memory circuit 104b, the first logic element 105 is turned off, the second logic element 106 is turned off, the third logic element 107 is turned on, and the switching element 103 is turned on as illustrated in FIG. 13 in accordance with the timing chart in FIG. 9. In each of the first unit memory circuit 104a and the second unit memory circuit 104b, electric charge held in the capacitor 102 is supplied to the memory element 101 via the switching element 103 that is on, whereby data saved in the capacitor 102 can be returned to the memory element 101. With the switching element 103 turned off, data can be held in the memory element 101.

Then, in the period 6, in the first unit memory circuit 104a, the first logic element 105 is turned on, the second logic element 106 is turned off, the third logic element 107 is turned on, and the switching element 103 is turned off as illustrated in FIG. 10 in accordance with the timing chart in FIG. 9. Thus, in the first unit memory circuit 104a, the potential of the signal Data is supplied to the memory element 101 via the first logic element 105.

In addition, in the period 6, in the second unit memory circuit 104b, the first logic element 105 is turned off, the second logic element 106 is turned on, the third logic element 107 is turned on, and the switching element 103 is turned off as illustrated in FIG. 10 in accordance with the timing chart in FIG. 9. Thus, in the period 6, in the second unit memory circuit 104b, the potential of the data which is returned from the capacitor 102 in the period 5 is held by the second logic element 106 and the third logic element 107.

Then, in the period 7, in the first unit memory circuit 104a, the first logic element 105 is turned off, the second logic element 106 is turned on, the third logic element 107 is turned on, and the switching element 103 is turned off as illustrated in FIG. 11 in accordance with the timing chart in FIG. 9. Thus, in the first unit memory circuit 104a, the potential of the signal Data input to the first unit memory circuit 104a in the period 6 is held by the second logic element 106 and the third logic element 107. The potential held by the second logic element 106 and the third logic element 107 is output from the first unit memory circuit 104a.

In addition, in the period 7, in the second unit memory circuit 104b, the first logic element 105 is turned on, the second logic element 106 is turned off, the third logic element 107 is turned on, and the switching element 103 is turned off as illustrated in FIG. 11 in accordance with the timing chart in FIG. 9. Thus, in the period 7, the output potential from the first unit memory circuit 104a is supplied to the second unit memory circuit 104b.

In an embodiment of the present invention, as described above, the first clock signals CLK1 and CLK1b and the second clock signals CLK2 and CLK2b are different types of signals. Accordingly, in an embodiment of the present invention, polarities of the first clock signals CLK1 and CLK1b and polarities of the second clock signals CLK2 and CLK2b can be inverted at different timings. In addition, the third clock signals CLK3 and CLK3b and the fourth clock signals CLK4 and CLK4b are different types of signals. Accordingly, in an embodiment of the present invention, polarities of the third clock signals CLK3 and CLK3b and polarities of the fourth clock signals CLK4 and CLK4b can be inverted at different timings.

Accordingly, in the first unit memory circuit 104a and the second unit memory circuit 104b, in the periods 1 to 4 and the periods 6 and 7, a state in which one of the first logic element 105 and the second logic element 106 is on and the other is off can be made. In an embodiment of the present invention, with the above configuration, writing of data to the memory element 101 and holding of the data in the memory element 101 can be performed sequentially.

Further, in the period 5 in which data saved in the capacitor 102 is returned to the memory element 101 after the power supply stop period is finished, both the first logic element 105 and the second logic element 106 can be turned off. With the above configuration, in an embodiment of the present invention, data can be output from the memory element 101 after data saved in the capacitor 102 is written into the memory element 101 in the period 5. Thus, even after saved data is returned to the memory element 101, the reliability of data output from the memory element 101 can be improved.

This embodiment can be implemented by being combined as appropriate with the above-described embodiment.
(Embodiment 3)

Next, a specific embodiment of a semiconductor device according to the present invention will be described. An example of the structure of the semiconductor device is illustrated as a block diagram in FIG. 14.

A semiconductor device 600 includes a control unit 601, an arithmetic logic unit (ALU) 602 corresponding to an arithmetic unit, a data cache 603, an instruction cache 604, a program counter 605, an instruction register 606, a main memory device 607, and a register file 608.

The control unit 601 has a function of decoding and carrying out an instruction which is input. The ALU 602 has a function of performing a variety of arithmetic operations such as four arithmetic operations and logic operations. The data cache 603 is a buffer memory device which temporary stores frequently-used data. The instruction cache 604 is a buffer memory device which temporary stores frequently-used instructions of instructions (programs) sent to the control unit 601. The program counter 605 is a register which stores an address of an instruction to be carried out next. The instruction register 606 is a register which stores an instruction to be carried out next. Data used for the arithmetic operations in the ALU 602 and an instruction which is carried out in the control unit 601 are stored in the main memory device 607. The register file 608 includes a plurality of registers including a general purpose register and can store data which is read out from the main memory device 607, data which is obtained during the arithmetic operations in the ALU 602, data which is obtained as a result of the arithmetic operations in the ALU 602, and the like.

Next, the operation of the semiconductor device 600 is described.

The control unit 601 reads an instruction from an address of the instruction cache 604 corresponding to the address of the instruction to be carried out next which is stored in the program counter 605, and makes the instruction register 606 store the instruction. When the instruction is not stored in the corresponding address of the instruction cache 604, the control unit 601 gets access to a corresponding address of the main memory device 607, reads the instruction from the main memory device 607, and makes the instruction register 606 store the instruction. In this case, the instruction is also stored in the instruction cache 604.

The control unit 601 decodes the instruction stored in the instruction register 606 and carries out the instruction. Specifically, the control unit 601 generates various signals for controlling the operation of the ALU 602 in accordance with the instruction.

When the instruction which is to be carried out is an arithmetic instruction, the control unit 601 makes the ALU 602 perform arithmetic operations using the data stored in the register file 608, and stores a result of the arithmetic operations in the register file 608.

When the instruction which is to be carried out is a loading instruction, the control unit 601, first, gets access to a corresponding address of the data cache 603, and checks whether or not a corresponding data exists in the data cache 603. When the corresponding data exists in the data cache 603, the data is copied from the corresponding address of the data cache 603 to the register file 608. When the corresponding data does not exist in the data cache 603, the data is copied from a corresponding address of the main memory device 607 to the corresponding address of the data cache 603, and then the data is copied from the corresponding address of the data cache 603 to the register file 608. Note that in the case where the corresponding data does not exist, since it is necessary to get access to the main memory device 607, it takes a long time to carry out the instruction as compared to the case where the control unit 601 gets access to only the buffer memory device such as the data cache 603. However, when not only the above data but also the address of the data and data of addresses of the vicinities of the data in the main memory device 607 are copied to the buffer memory device, second and the subsequent accesses to the address of the data and the addresses of the vicinities thereof in the main memory device 607 can be performed at high speed.

When the instruction which is to be carried out is a store instruction, the control unit 601 stores data of the register file 608 in a corresponding address of the data cache 603. In this case, the control unit 601, first, gets access to the corresponding address of the data cache 603 and checks whether or not the corresponding data can be stored in the data cache 603. When the data can be stored in the data cache 603, the data is copied from the register file 608 to the corresponding address of the data cache 603. When the data cannot be stored, a new corresponding address is assigned in part of the data cache 603, and the data is copied from the register file 608 to the corresponding address of the data cache 603. Note that the data may be copied to the main memory device 607 immediately after the data is copied to the data cache 603. Alternatively, some pieces of data may be copied to the data cache 603 and then the pieces of data may be collectively copied to the main memory device 607.

Then, after the control unit 601 carries out the instruction, the control unit 601 gets access to the program counter 605 again, and repeats the above operation in which an instruction read out from the instruction register 606 is decoded and carried out.

Figure 14:
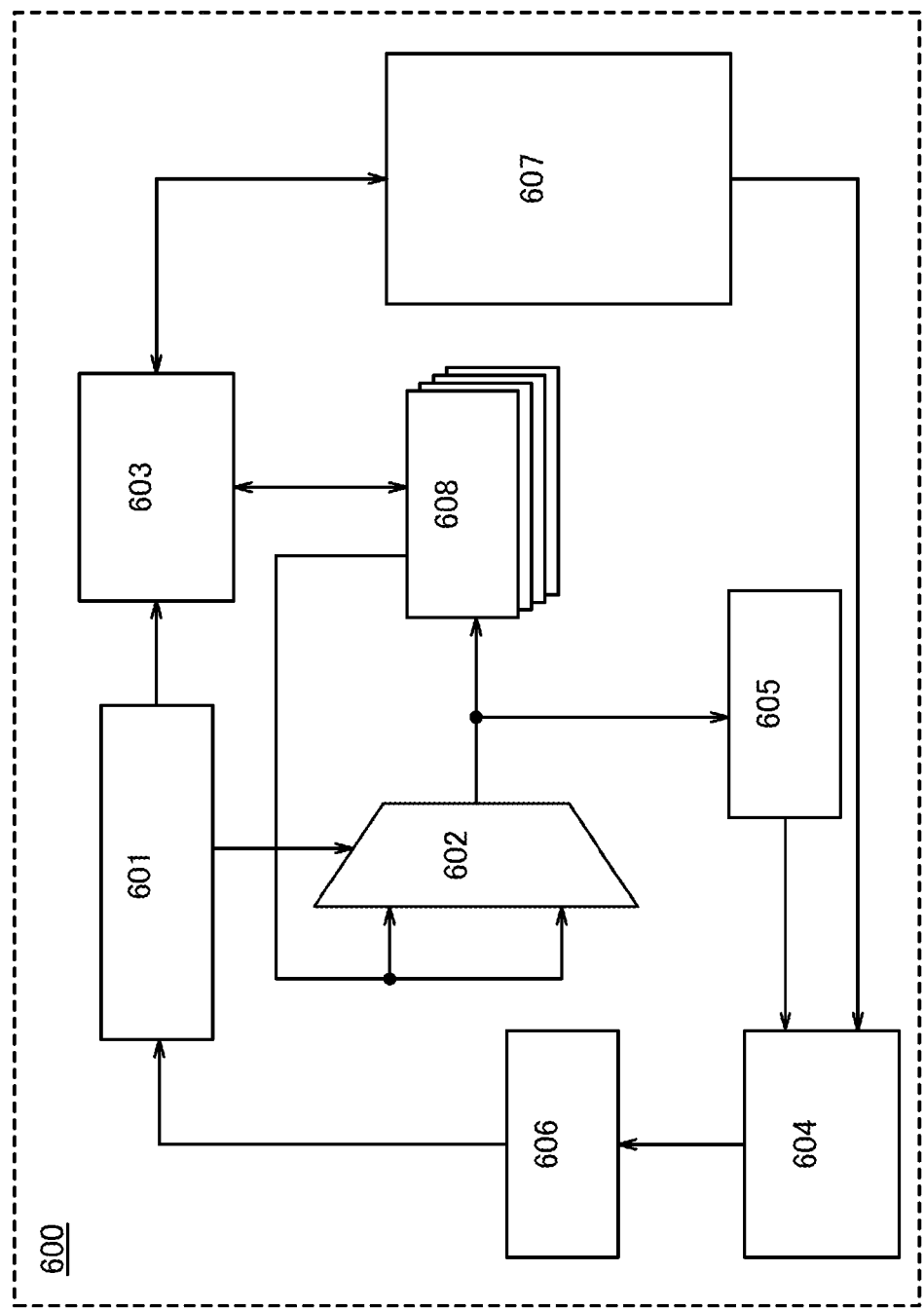
FIG. 14 is a block diagram of a semiconductor device.

Note that in the semiconductor device 600 illustrated in FIG. 14, the memory device having the above configuration is provided for the buffer memory device such as the data cache 603 or the instruction cache 604. The ALU 602 selects the holding operation in the buffer memory device such as the data cache 603 or the instruction cache 604. In other words, the ALU 602 selects whether data is held in the memory element or in the capacitor in the data cache 603 or in the instruction cache 604. When data holding in the memory element is selected, power supply voltage is supplied to the memory element in the data cache 603 or the instruction cache 604. When data holding in the capacitor is selected, the data is rewritten in the capacitor and supply of power supply voltage to the memory element in the data cache 603 or the instruction cache 604 is stopped. The stop of supply of power supply voltage can be performed by providing a switching element between a unit memory circuit group and a node to which the power supply potential VDD or the reference voltage is supplied.

This embodiment can be implemented by being combined as appropriate with any of the above-described embodiments.

(Embodiment 4)

In a memory device according to an embodiment of the present invention, a transistor included in a switching element can be formed using an amorphous, microcrystalline, polycrystalline, or single crystal semiconductor such as silicon or germanium for a channel formation region. As a silicon semiconductor, any of the following can be used: amorphous silicon manufactured by a vapor phase growth method such as a plasma CVD method, or a sputtering method; polycrystalline silicon obtained in such a manner that amorphous silicon is crystallized by treatment such as laser annealing; single crystal silicon obtained in such a manner that a surface portion of a single crystal silicon wafer is separated by implantation of hydrogen ions or the like into the silicon wafer; and the like.

Alternatively, a transistor included in a switching element can be formed using a semiconductor such as an oxide semiconductor having a wider band gap and a higher intrinsic carrier density than silicon for a channel formation region. A transistor formed using a semiconductor having the above characteristics for a channel formation region has much smaller off-state current than a transistor formed using a normal semiconductor such as silicon or germanium.

In the memory device according to an embodiment of the present invention, supply of electric charge to a capacitor, holding of electric charge in a capacitor, and release of electric charge from a capacitor are controlled by the switching element. Thus, the length of a data holding period of the capacitor depends on the amount of electric charge, which is accumulated in the capacitor, leaking through the switching element. The smaller the amount of electric charge leaking through the switching element is, the longer the data holding period of the capacitor can be. Accordingly, when electric charge accumulated in the capacitor is held by using the switching element including a transistor whose off-state current is extremely small, leakage of electric charge from the capacitor can be prevented, and thus, the data holding period can be longer. With the above configuration, even when the power supply stop period is long, the frequency of rewriting data in the capacitor can be low, so that power consumption can be further reduced.

Unless otherwise specified, in the case of an n-channel transistor, an off-state current in this specification is a current which flows between a source and a drain when a voltage of the drain is higher than that of the source and that of a gate electrode while the voltage of the gate electrode is less than or equal to zero when a reference voltage is the voltage of the source. Alternatively, in the case of a p-channel transistor, off-state current in this specification is a current which flows between a source and a drain when a voltage of the drain is lower than that of the source and that of a gate electrode while the voltage of the gate electrode is greater than or equal to zero when a reference voltage is the voltage of the source.

In an embodiment of the present invention, a transistor included in a memory element may include a semiconductor such as silicon having crystallinity or germanium having crystallinity in a channel formation region. Alternatively, the transistor may include a semiconductor whose band gap is wider than that of silicon and whose intrinsic carrier density is lower than that of silicon, such as an oxide semiconductor, in a channel formation region, like the switching element. When a semiconductor such as silicon having crystallinity or germanium having crystallinity has higher mobility than an oxide semiconductor, in the case where the transistor included in the memory element includes a semiconductor such as silicon having crystallinity or germanium having crystallinity in a channel formation region, high-speed operation of a memory device, moreover, a semiconductor device can be ensured.

In this embodiment, an example of a specific structure of the memory device is illustrated. In this embodiment, an example is illustrated in which the memory element includes a transistor including silicon having crystallinity in a channel formation region, and a transistor including an oxide semiconductor in a channel formation region for controlling supply of electric charge to the capacitor, holding of electric charge in the capacitor, and release of electric charge from the capacitor.

Figure 15:
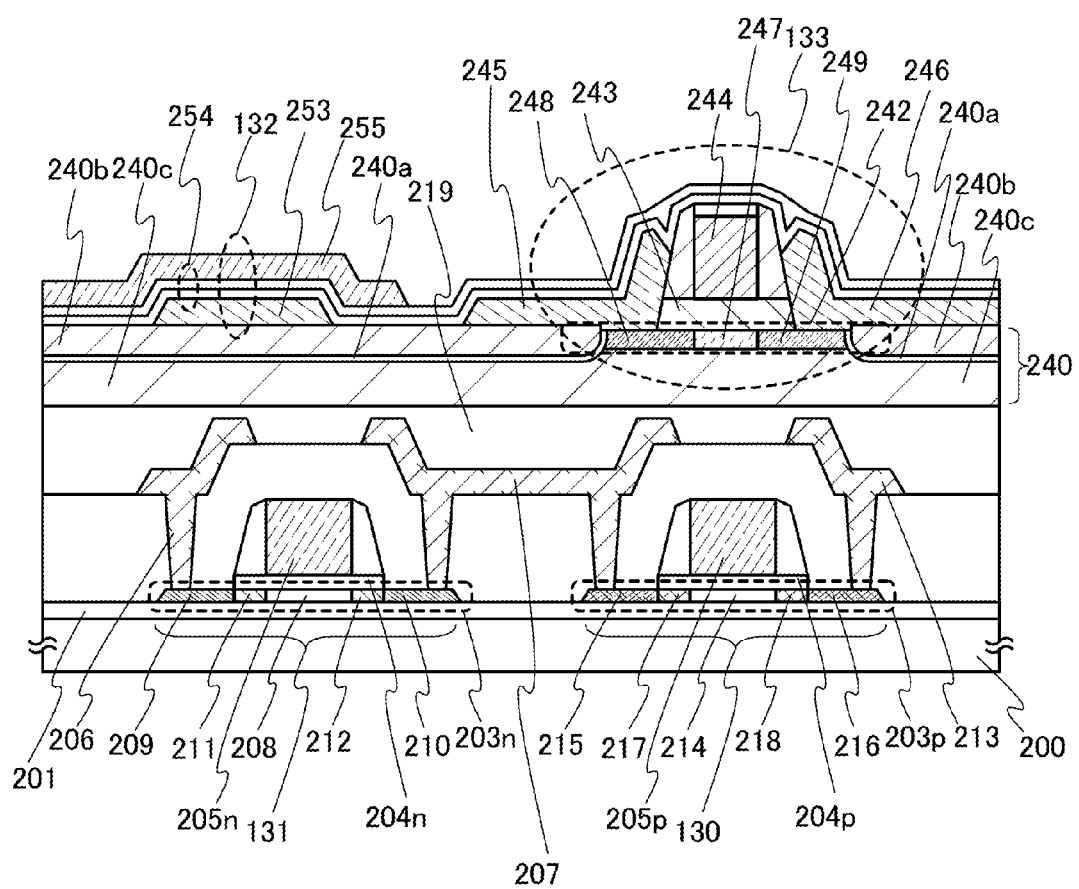
FIG. 15 is a cross-sectional view of a memory device.

FIG. 15 is an example of a cross-sectional view illustrating structures of a p-channel transistor 130 and an n-channel transistor 131 included in a memory element, a capacitor 132, and a transistor 133 serving as a switching element.

A memory device illustrated in FIG. 15 includes the n-channel transistor 131 and the p-channel transistor 130 over a substrate 200. An insulating film 201 is formed over a surface of the substrate 200.

The n-channel transistor 131 includes a semiconductor film 203n including silicon having crystallinity, a gate insulating film 204n over the semiconductor film 203n, a gate electrode 205n provided in a portion overlapping with the semiconductor film 203n with the gate insulating film 204n provided therebetween, and a conductive film 206 and a conductive film 207 which are connected to the semiconductor film 203n. The semiconductor film 203n includes a first region 208 serving as a channel formation region and second regions 209 and 210 serving as a source and a drain. The first region 208 is sandwiched between the second regions 209 and 210. FIG. 15 illustrates an example of the case where the semiconductor film 203n includes third regions 211 and 212 serving as lightly doped drain (LDD) regions between the first region 208 and the second region 209 and between the first region 208 and the second region 210.

The p-channel transistor 130 includes a semiconductor film 203p including silicon having crystallinity, a gate insulating film 204p over the semiconductor film 203p, a gate electrode 205p provided in a portion overlapping with the semiconductor film 203p with the gate insulating film 204p provided therebetween, and the conductive film 207 and a conductive film 213 which are connected to the semiconductor film 203p. The semiconductor film 203p includes a first region 214 serving as a channel formation region and second regions 215 and 216 serving as a source and a drain. The first region 214 is sandwiched between the second regions 215 and 216. FIG. 15 illustrates an example of the case where the semiconductor film 203p includes third regions 217 and 218 serving as LDD regions between the first region 214 and the second region 215 and between the first region 214 and the second region 216.

In FIG. 15, the n-channel transistor 131 and the p-channel transistor 130 share the conductive film 207.

Further, FIG. 15 illustrates the case where the n-channel transistor 131 and the p-channel transistor 130 each include a thin semiconductor film; however, the n-channel transistor 131 and the p-channel transistor 130 may each have a channel formation region in a bulk semiconductor substrate. For the thin semiconductor film, for example, polycrystalline silicon obtained by crystallization of amorphous silicon with the use of a laser, single crystal silicon obtained in such a manner that hydrogen ions or the like are implanted into a single crystal silicon wafer and a surface portion of the single crystal semiconductor wafer is separated, and the like can be used.

Further, in the memory device illustrated in FIG. 15, an insulating film 219 is formed over the conductive film 206, the conductive film 207, and the conductive film 213. An insulating film 240 including a first oxide insulating film 240a, a second oxide insulating film 240b, and a third oxide insulating film 240c is provided over the insulating film 219. The transistor 133 is provided over the insulating film 240.

The first oxide insulating film 240a and the third oxide insulating film 240c are formed using an oxide insulating film from which part of oxygen is released by heating. As such an oxide insulating film from which part of oxygen is released by heating, an insulating film which contains oxygen at a proportion exceeding the stoichiometric proportion is preferably used. Silicon oxide, silicon oxynitride, silicon nitride oxide, gallium oxide, hafnium oxide, yttrium oxide, or the like can be used for the first oxide insulating film 240a and the third oxide insulating film 240c.

The second oxide insulating film 240b is formed using an oxide insulating film which prevents diffusion of oxygen. The second oxide insulating film 240b is formed using aluminum oxide, aluminum oxynitride, or the like, for example. As for aluminum oxide, aluminum oxide containing oxygen at a proportion satisfying the stoichiometric proportion or aluminum oxide containing oxygen at a proportion exceeding the stoichiometric proportion (AlOx, x is greater than or equal to 3/2) is preferably used. In addition, in aluminum oxynitride, part of oxygen in aluminum oxide containing oxygen at a proportion satisfying the stoichiometric proportion is replaced with nitrogen.

Note that "to release part of oxygen by heating" means that the amount of released oxygen is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis on an oxygen atom basis.

A measurement method of the amount of desorbed oxygen on an oxygen atom basis using TDS analysis is described below.

The desorption amount of a gas in the TDS analysis is proportional to an integral value of a spectrum. Therefore, the amount of a released gas can be calculated from the ratio between the integral value of a spectrum of an insulating film and the reference value of a standard sample. The reference value of a standard sample refers to the ratio of the density of a predetermined atom contained in a sample to the integral value of a spectrum.

For example, the amount of the desorbed oxygen molecules ($N_{O2}$) from an insulating film can be found according to the following Formula 1 a with the TDS analysis results of a silicon wafer containing hydrogen at a predetermined density which is the standard sample and the TDS analysis results of an insulating film. CH$_3$OH, which is given as a gas having a mass number of 32, is unlikely to be present in the insulating film. Therefore, all spectra having a mass number of 32 which are obtained by the TDS analysis are assumed to originate from an oxygen molecule. Further, an oxygen molecule including an oxygen atom having a mass number of 17 or 18 which is an isotope of oxygen atom is assumed not to be present because the proportion of such a molecule in the natural world is minimal $$N_{O2} = N_{H2}/S_{H2} \times S_{O2} \times a \quad \text{(Formula 1)}$$

$N_{H2}$ is the value obtained by conversion of the amount of hydrogen molecules desorbed from the standard sample into densities. $S_{H2}$ is the integral value of a spectrum when the standard sample is subjected to TDS analysis. Here, the reference value of the standard sample is set to $N_{H2}/S_{H2}$. $S_{O2}$ is the integral value of a spectrum when the insulating film is subjected to TDS analysis. α is a coefficient affecting the intensity of the spectrum in the TDS analysis. Refer to Japanese Published Patent Application No. H06-275697 for details of the Formula 1. Note that the amount of desorbed oxygen from the above insulating film is measured with a thermal desorption spectroscopy apparatus produced by ESCO Ltd., EMD-WA1000S/W using a silicon wafer containing hydrogen atoms at $1 \times 10^{16}$ atoms/cm$^3$ as the standard sample.

Further, in the TDS analysis, some amount of oxygen is detected as an oxygen atom. The ratio between oxygen molecules and oxygen atoms can be calculated from the ionization rate of the oxygen molecules. Note that, since the above a includes the ionization rate of oxygen molecules, the amount of the desorbed oxygen atoms can also be estimated through the evaluation of the amount of the desorbed oxygen molecules.

Note that $N_{O2}$ is the amount of desorbed oxygen molecules. The amount of released oxygen on an oxygen atom basis is twice the amount of the desorbed oxygen molecules.

In the above structure, the insulating film from which oxygen is released by heating may be oxygen-excess silicon oxide (SiO$_X$(X>2)). In the oxygen-excess silicon oxide (SiO$_X$(X>2)), the number of oxygen atoms per unit volume is more than twice the number of silicon atoms per unit volume. The number of silicon atoms and the number of oxygen atoms per unit volume are measured by Rutherford backscattering spectrometry.

Specifically, the transistor 133 includes an oxide semiconductor film 242, a gate insulating film 243 over the oxide semiconductor film 242, a gate electrode 244 which is provided in a portion overlapping with the oxide semiconductor film 242 with the gate insulating film 243 provided therebetween, and a conductive film 245 and a conductive film 246 which are connected to the oxide semiconductor film 242. The oxide semiconductor film 242 includes a first region 247 which overlaps with the gate electrode 244 and at least part of which serves as a channel formation region, and second regions 248 and 249 which serve as a source and a drain and between which the first region 247 is sandwiched.

As one example of a semiconductor material which has a wider band gap than a silicon semiconductor and has a lower intrinsic carrier density than silicon, a compound semiconductor such as silicon carbide (SiC) or gallium nitride (GaN) can be given in addition to an oxide semiconductor. The oxide semiconductor has an advantage of high mass productivity because the oxide semiconductor can be formed by a sputtering method or a wet process, unlike silicon carbide or gallium nitride. Further, unlike silicon carbide or gallium nitride, the oxide semiconductor can be deposited even at room temperature; thus, deposition over a glass substrate or deposition over an integrated circuit using silicon is possible. Further, a larger substrate can be used. Accordingly, among the semiconductors with wide band gaps, the oxide semiconductor particularly has an advantage of high mass productivity. Further, in the case where an oxide semiconductor with high crystallinity is to be obtained in order to improve the performance of a transistor (e.g., field-effect mobility), the oxide semiconductor with crystallinity can be easily obtained by heat treatment at 250° C. to 800° C.

Next, a specific cross-sectional structure of the transistor 133 illustrated in FIG. 15 will be described with reference to FIGS. 16A to 16C.

Figure 16A:
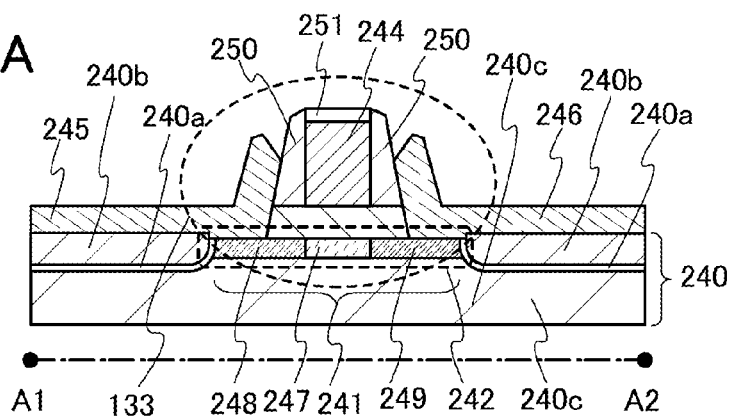
FIGS. 16A and 16C are cross-sectional views of a transistor and FIG. 16B is a top view of the transistor.
Figure 16B:
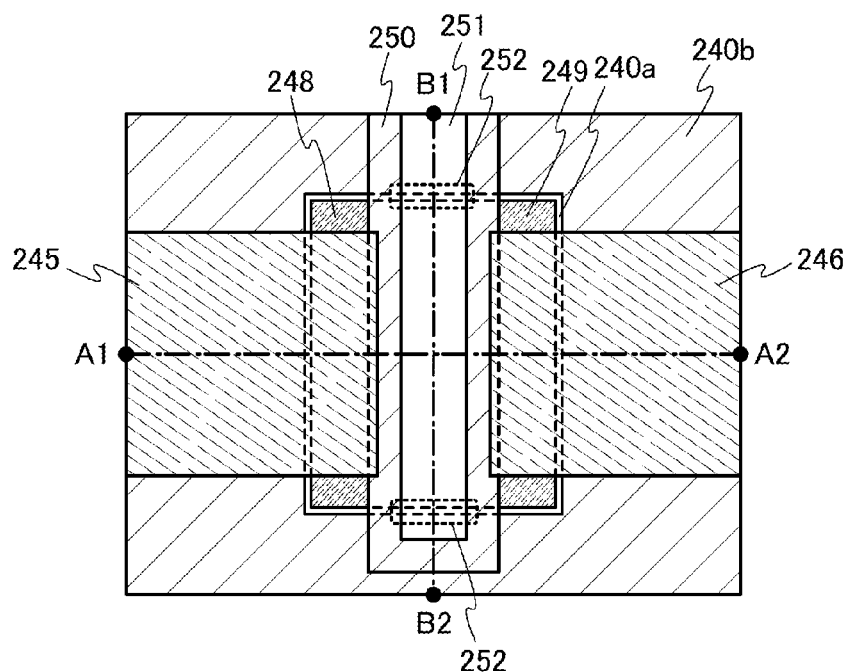
Figure 16C:
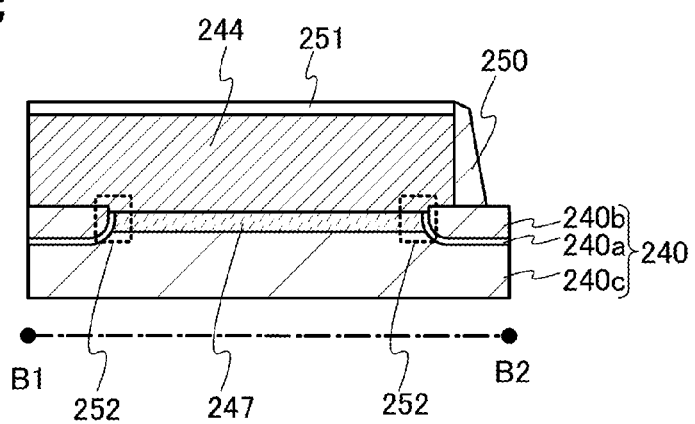

FIG. 16A is a cross-sectional view of the insulating film 240 and the transistor 133 and FIG. 16B is a top view of the insulating film 240 and the transistor 133. A cross-sectional view along dashed and dotted line A1-A2 in FIG. 16B corresponds to FIG. 16A. FIG. 16C is a cross-sectional view of the insulating film 240 and the transistor 133 along dashed and dotted line B1-B2 in FIG. 16B.

In the transistor 133, a sidewall 250 including an insulating film is provided on a side portion of the gate electrode 244, and an insulating film 251 is provided over the gate electrode 244. Further, part of the conductive film 245 and part of the conductive film 246 are in contact with the sidewall 250. The conductive film 245 and the conductive film 246 are not necessarily in contact with the sidewall 250. However, when the conductive film 245 and the conductive film 246 are formed in contact with the sidewall 250, the size of the area where the oxide semiconductor film 242 is in contact with the conductive film 245 and the conductive film 246 can be prevented from changing even in the case where the conductive film 245 and the conductive film 246 deviate from appropriate positions. Accordingly, variation in on-state current of the transistor 133 due to deviation of positions of the conductive film 245 and the conductive film 246 can be prevented.

Note that the insulating film 251 over the gate electrode 244 is not necessarily provided. However, when the insulating film 251 is provided, electric conduction between the conductive film 245 and the gate electrode 244 and between the conductive film 246 and the gate electrode 244 can be prevented even in the case where the conductive film 245 or the conductive film 246 is formed over the gate electrode 244.

In the insulating film 240, the first oxide insulating film 240a and the second oxide insulating film 240b are stacked in this order over the third oxide insulating film 240c positioned in the lowermost layer. An opening 241 is formed in the first oxide insulating film 240a and the second oxide insulating film 240b, and the oxide semiconductor film 242 of the transistor 133 is provided in the opening 241. The first oxide insulating film 240a is provided in the periphery of the oxide semiconductor film 242 so as to be in contact with the end portion of the oxide semiconductor film 242. The second oxide insulating film 240b is provided in the periphery of the oxide semiconductor film 242 with the first oxide insulating film 240a provided therebetween. The third oxide insulating film 240c is provided below the oxide semiconductor film 242.

In the above structure, oxygen released from the first oxide insulating film 240a by heating can be prevented from passing through the second oxide insulating film 240b; thus, the oxygen is effectively supplied to end portions 252 of the oxide semiconductor film 242 in the first region 247. In addition, oxygen released from the third oxide insulating film 240c is supplied to a lower portion of the oxide semiconductor film 242. Note that oxygen vacancies due to release of oxygen are easily formed at an end portion of the oxide semiconductor film 242 in the transistor 133 in which the oxide semiconductor is used in a channel formation region because of etching treatment for etching the oxide semiconductor film 242 into a desired shape, exposure of the end portion of the oxide semiconductor film 242 to a reduced-pressure atmosphere, or the like. Since oxygen vacancies become a path through which carriers move, a parasitic channel is formed when oxygen vacancies are formed at the end portion of the oxide semiconductor film 242 and thus the off-state current of the transistor 133 is increased. However, in an embodiment of the present invention, with the above structure, oxygen vacancies are prevented from being formed at the end portions 252 of the oxide semiconductor film 242 in the first region 247 and thus the off-state current can be reduced.

Further, as illustrated in FIG. 15, the capacitor 132 includes a conductive film 253 over the insulating film 240, an insulating film 254 over the conductive film 253, and a conductive film 255 which is provided in a position overlapping with the conductive film 253 with the insulating film 254 provided therebetween. The insulating film 254 is also provided over the transistor 133. The conductive film 253 and the conductive film 245 may be electrically connected to each other, or the conductive film 253 and the conductive film 245 may be one conductive film.

Note that FIG. 15 illustrates the case where the capacitor 132, as well as the transistor 133, is formed over the insulating film 240; however, the capacitor 132, as well as the n-channel transistor 131 and the p-channel transistor 130, may be formed below the insulating film 240.

FIG. 15 illustrates the case where the insulating film 219 is provided between the insulating film 240 and the n-channel transistor 131 and between the insulating film 240 and the p-channel transistor 130. However, the insulating film 219 is not necessarily provided. In the case where the insulating film 219 is not provided, the insulating film 240 is provided in contact with the conductive film 206, the conductive film 207, and the conductive film 213.

Further, in FIG. 15, the transistor 133 includes the gate electrode 244 on at least one side of the oxide semiconductor film 242. Alternatively, a pair of gate electrodes may be provided with the oxide semiconductor film 242 provided therebetween.

Figure 17A:
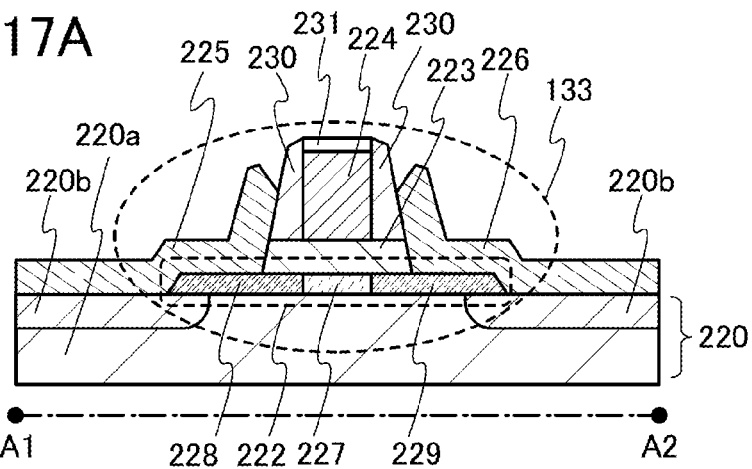
FIGS. 17A and 17C are cross-sectional views of a transistor and FIG. 17B is a top view of the transistor.
Figure 17B:
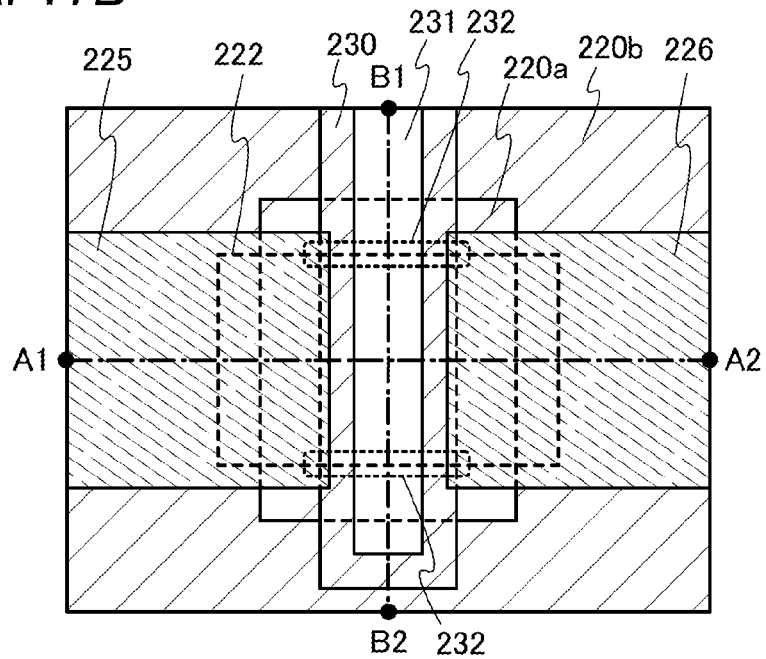
Figure 17C:
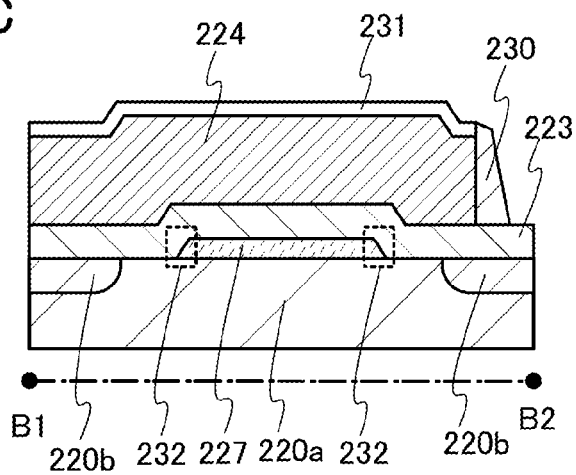

The structure of a memory device according to an embodiment of the present invention in which the structure of the transistor 133 is different from that of the memory device illustrated in FIG. 15 is described. FIGS. 17A to 17C illustrate an example of the structure of the transistor 133. In FIGS. 17A to 17C, the transistor 133 is provided over an insulating film 220 including a first oxide insulating film 220a and a second oxide insulating film 220b. FIG. 17A is a cross-sectional view of the insulating film 220 and the transistor 133 and FIG. 17B is a top view of the insulating film 220 and the transistor 133. A cross-sectional view taken along dashed and dotted line A1-A2 in FIG. 17B corresponds to FIG. 17A. FIG. 17C is a cross-sectional view of the insulating film 220 and the transistor 133 taken along dashed and dotted line B1-B2 in FIG. 17B.

The first oxide insulating film 220a is formed using an oxide insulating film from which part of oxygen is released by heating. As such an oxide insulating film from which part of oxygen is released by heating, an insulating film which contains oxygen at a proportion exceeding the stoichiometric proportion is preferably used. Silicon oxide, silicon oxynitride, silicon nitride oxide, gallium oxide, hafnium oxide, yttrium oxide, or the like can be used for the first oxide insulating film 220a.

The second oxide insulating film 220b is formed using an oxide insulating film which prevents diffusion of oxygen. The second oxide insulating film 220b is formed using aluminum oxide, aluminum oxynitride, or the like, for example. As for aluminum oxide, aluminum oxide containing oxygen at a proportion satisfying the stoichiometric proportion or aluminum oxide containing oxygen at a proportion exceeding the stoichiometric proportion (AlOx, x is greater than or equal to 3/2) is preferably used. In addition, in aluminum oxynitride, part of oxygen in aluminum oxide containing oxygen at a proportion satisfying the stoichiometric proportion is replaced with nitrogen.

The transistor 133 includes an oxide semiconductor film 222 over the insulating film 220, a gate insulating film 223 over the oxide semiconductor film 222, a gate electrode 224 which is provided in a portion overlapping with the oxide semiconductor film 222 with the gate insulating film 223 provided therebetween, and a conductive film 225 and a conductive film 226 which are connected to the oxide semiconductor film 222. The oxide semiconductor film 222 includes a first region 227 which overlaps with the gate electrode 224 and at least part of which serves as a channel formation region, and second regions 228 and 229 which serve as a source and a drain and between which the first region 227 is sandwiched.

In the transistor 133, a sidewall 230 including an insulating film is provided on a side portion of the gate electrode 224, and an insulating film 231 is provided over the gate electrode 224. Further, part of the conductive film 225 and part of the conductive film 226 are in contact with the sidewall 230. The conductive film 225 and the conductive film 226 are not necessarily in contact with the sidewall 230. However, when the conductive film 225 and the conductive film 226 are formed in contact with the sidewall 230, the size of the area where the oxide semiconductor film 222 is in contact with the conductive film 225 and the conductive film 226 can be prevented from changing even in the case where the conductive film 225 and the conductive film 226 deviate from appropriate positions. Accordingly, variation in on-state current of the transistor 133 due to deviation of positions of the conductive film 225 and the conductive film 226 can be prevented.

Note that the insulating film 231 over the gate electrode 224 is not necessarily provided. However, when the insulating film 231 is provided, electric conduction between the conductive film 225 and the gate electrode 224 and between the conductive film 226 and the gate electrode 224 can be prevented even in the case where the conductive film 225 or the conductive film 226 is formed over the gate electrode 224.

Further, in the insulating film 220, the second oxide insulating film 220b is provided in the periphery of the first oxide insulating film 220a. The first region 227 of the oxide semiconductor film 222 is in contact with the first oxide insulating film 220a and the second regions 228 and 229 of the oxide semiconductor film 222 are in contact with the first oxide insulating film 220a and the second oxide insulating film 220b.

In the above structure, oxygen released from the first oxide insulating film 220a by heating can be prevented from passing through the second oxide insulating film 220b; thus, the oxygen is effectively supplied to end portions 232 of the oxide semiconductor film 222 in the first region 227. Note that oxygen vacancies due to release of oxygen are easily caused at an end portion of the oxide semiconductor film 222 in the transistor 133 in which the oxide semiconductor is used in a channel formation region because of etching treatment for etching the oxide semiconductor film 222 into a desired shape, exposure of the end portion of the oxide semiconductor film 222 to a reduced-pressure atmosphere, or the like. Since oxygen vacancies become a path through which carriers move, a parasitic channel is formed when oxygen vacancies are formed at the end portion of the oxide semiconductor film 222 and thus the off-state current of the transistor 133 is increased. However, in an embodiment of the present invention, with the above structure, oxygen vacancies are prevented from being formed at the end portions 232 of the oxide semiconductor film 222 in the first region 227 and thus the off-state current can be reduced.

Further, in FIGS. 17A to 17C, the transistor 133 includes the gate electrode 224 on at least one side of the oxide semiconductor film 222. Alternatively, a pair of gate electrodes may be provided with the oxide semiconductor film 222 provided therebetween.

Note that a highly purified oxide semiconductor (purified OS) obtained by reduction of impurities such as moisture or hydrogen which serves as an electron donor (donor) and by reduction of oxygen vacancies is an intrinsic (i-type) semiconductor or a substantially i-type semiconductor. Therefore, a transistor including the oxide semiconductor has a characteristic of very small off-state current. Furthermore, the band gap of the oxide semiconductor is greater than or equal to 2 eV, preferably greater than or equal to 2.5 eV, more preferably greater than or equal to 3 eV. With the use of the oxide semiconductor film which has been highly purified by sufficiently reducing the concentration of impurities such as moisture and hydrogen and reducing oxygen vacancies, the off-state current of the transistor can be reduced.

It can be proved through various experiments that the off-state current of the transistor using the highly purified oxide semiconductor film for a channel formation region is small. For example, even when an element has a channel width of $1\times10^6$ μm and a channel length of 10 μm, off-state current can be less than or equal to the measurement limit of a semiconductor parameter analyzer, i.e., less than or equal to $1\times10^{-13}$ A, at voltage (drain voltage) between the source electrode and the drain electrode of from 1 V to 10 V. In this case, it can be found that an off-state current corresponding to a value obtained by dividing the off-state current by the channel width of the transistor is less than or equal to 100 zA/μm. In addition, a capacitor and a transistor were connected to each other and the off-state current was measured by using a circuit in which electric charge flowing into or from the capacitor was controlled by the transistor. In the measurement, a highly purified oxide semiconductor film was used for a channel formation region of the transistor, and an off-state current of the transistor was measured from a change in the amount of electric charge of the capacitor per unit time. As a result, it was found that in the case where the voltage between the source electrode and the drain electrode of the transistor was 3 V, a smaller off-state current of several tens yoctoampere per micrometer (yA/μm) was able to be obtained. Consequently, the transistor whose channel formation region is formed in a highly purified oxide semiconductor film has much smaller off-state current than a transistor including crystalline silicon.

Note that an oxide semiconductor preferably contains at least indium (In) or zinc (Zn). In particular, In and Zn are preferably contained. The oxide semiconductor preferably contains, in addition to In and Zn, gallium (Ga) serving as a stabilizer that reduces variations in electric characteristics of the transistor using the above-described oxide. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used. The above oxide semiconductor may contain silicon.

Note that, for example, an In—Ga—Zn-based oxide means an oxide containing In, Ga, and Zn, and there is no limitation on the ratio of In, Ga, and Zn. Further, the In—Ga—Zn-based oxide may contain a metal element other than In, Ga, and Zn. An In—Ga—Zn-based oxide has sufficiently high resistance when there is no electric field and thus the off-state current can be sufficiently reduced. In addition, also having high mobility, the In—Ga—Zn-based oxide is suitable for a semiconductor material used for a semiconductor device.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio in the neighborhood of the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio in the neighborhood of the above atomic ratios may be used.

However, the composition is not limited to those described above, and a material having an appropriate composition may be used in accordance with necessary electric characteristics (such as mobility, threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

Further, the oxide semiconductor may be either amorphous or crystalline. In the latter case, the oxide semiconductor may be either single crystal or polycrystalline, may have a structure in which part of the oxide semiconductor is crystalline, may have an amorphous structure including a crystalline portion, or may have a non-amorphous structure. As an example of such a partly crystalline structure, an oxide semiconductor including a crystal with c-axis alignment (also referred to as a c-axis-aligned crystalline oxide semiconductor (CAAC-OS)), which has a triangular or hexagonal atomic arrangement when seen from the direction of an a-b plane, a surface, or an interface, may be used. In the crystal, metal atoms are arranged in a layered manner, or metal atoms and oxygen atoms are arranged in a layered manner, when seen from the direction perpendicular to the c-axis, and the direction of the a-axis or the b-axis is varied in the a-b plane (the crystal rotates around the c-axis).

In an oxide semiconductor in an amorphous state, a flat surface can be obtained with relative ease, so that when a transistor is manufactured with the use of the oxide semiconductor, interface scattering can be reduced, and relatively high mobility can be obtained with relative ease.

In an oxide semiconductor having crystallinity, defects in the bulk can be further reduced and when the surface flatness of the oxide semiconductor is improved, mobility of higher than that of an oxide semiconductor in an amorphous state can be obtained. In order to improve the surface flatness, the oxide semiconductor is preferably formed over a flat surface. Specifically, the oxide semiconductor may be formed over a surface with an average surface roughness (Ra) of less than or equal to 1 nm, preferably less than or equal to 0.3 nm, more preferably less than or equal to 0.1 nm.

Note that Ra is obtained by expanding centerline average roughness, which is defined by JIS B0601, into three dimensions so as to be applicable to a surface. Moreover, Ra can be expressed as an average value of the absolute values of deviations from a reference surface to a specific surface and is defined by Formula 2.

$$Ra = \frac{1}{S_0} \int_{y_1}^{y_2} \int_{x_1}^{x_2} |f(x, y) - Z_0| dx\, dy \qquad \text{(Formula 2)}$$

Note that in Formula 2, $S_0$ represents the area of a measurement surface (a quadrangular region which is defined by four points represented by the coordinates $(x_1, y_1)$, $(x_1, y_2)$, $(x_2, y_1)$, and $(x_2, y_2)$), and $Z_0$ represents average height of a measurement surface. Ra can be evaluated using an atomic force microscope (AFM).

For example, the oxide semiconductor film can be formed by a sputtering method using a target containing indium (In), gallium (Ga), and zinc (Zn). In the case of forming an In—Ga—Zn-based oxide semiconductor film by a sputtering method, it is preferable to use a target of an In—Ga—Zn-based oxide having an atomic ratio of In:Ga:Zn=1:1:1, 4:2:3, 3:1:2, 1:1:2, 2:1:3, or 3:1:4. When an oxide semiconductor film is formed using a target of an In—Ga—Zn-based oxide having the aforementioned atomic ratio, a polycrystal or CAAC is likely to be formed. The filling factor of the target containing In, Ga, and Zn is higher than or equal to 90% and lower than or equal to 100%, and preferably higher than or equal to 95% and lower than 100%. With the use of the target with a high filling rate, a dense oxide semiconductor film is formed.

In the case where an In—Zn-based oxide material is used as an oxide semiconductor, a target of the In—Zn-based oxide has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), more preferably In:Zn=1.5:1 to 15:1 in an atomic ratio ($In_2O_3$:ZnO=3:4 to 15:2 in a molar ratio). For example, in a target used for formation of an oxide semiconductor film including an In—Zn-based oxide which has an atomic ratio of In:Zn:O=X:Y:Z, the relation of Z>1.5X+Y is satisfied. The mobility can be improved by keeping the ratio of Zn within the above range.

Specifically, the oxide semiconductor film is formed as follows: the substrate is held in a treatment chamber with pressure reduced, residual moisture in the treatment chamber is removed, a sputtering gas from which hydrogen and moisture are removed is introduced, and the above-described target is used. The substrate temperature may be higher than or equal to 100° C. and lower than or equal to 600° C., preferably higher than or equal to 200° C. and lower than or equal to 400° C. in film formation. By forming the oxide semiconductor film in a state where the substrate is heated, the concentration of impurities included in the formed oxide semiconductor film can be reduced. In addition, damage by sputtering can be reduced. In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. When the treatment chamber is evacuated with the cryopump, for example, a hydrogen atom, a compound containing a hydrogen atom such as water ($H_2O$) (preferably, also a compound containing a carbon atom), and the like are removed, whereby the impurity concentration in the oxide semiconductor film formed in the treatment chamber can be reduced.

Note that the oxide semiconductor film formed by sputtering or the like contains a large amount of moisture or hydrogen (including a hydroxyl group) as an impurity in some cases. Moisture or hydrogen easily form a donor level and thus serve as impurities in the oxide semiconductor. Thus, in an embodiment of the present invention, in order to reduce impurities such as moisture or hydrogen in the oxide semiconductor film (in order to perform dehydration or dehydrogenation), the oxide semiconductor film is subjected to heat treatment in a reduced-pressure atmosphere, an inert gas atmosphere of nitrogen, a rare gas, or the like, an oxygen gas atmosphere, or ultra dry air (the moisture amount is less than or equal to 20 ppm (−55° C. by conversion into a dew point), preferably less than or equal to 1 ppm, more preferably less than or equal to 10 ppb, in the case where measurement is performed by a dew point meter of a cavity ring down laser spectroscopy (CRDS) method).

By performing heat treatment on the oxide semiconductor film, moisture or hydrogen in the oxide semiconductor film can be released. Specifically, heat treatment may be performed at a temperature of higher than or equal to 250° C. and lower than or equal to 750° C., preferably higher than or equal to 400° C. and lower than the strain point of a substrate. For example, heat treatment may be performed at 500° C. for approximately three minutes to six minutes, inclusive. When an RTA method is used for the heat treatment, dehydration or dehydrogenation can be performed for a short time; therefore, treatment can be performed even at a temperature of higher than the strain point of a glass substrate.

Note that in some cases, the heat treatment makes oxygen released from the oxide semiconductor film and an oxygen vacancy is formed in the oxide semiconductor film. Accordingly, an insulating film containing oxygen is used for an insulating film in contact with the oxide semiconductor film, such as a gate insulating film, in an embodiment of the present invention. Then, heat treatment is performed after formation of the insulating film containing oxygen, so that oxygen is supplied from the insulating film to the oxide semiconductor film. With the above structure, oxygen vacancies that serve as donors can be reduced and the stoichiometric proportion of the oxide semiconductor included in the oxide semiconductor film can be satisfied. As a result, the oxide semiconductor film can be made substantially i-type and variation in electric characteristics of the transistor due to oxygen vacancies can be reduced, which results in improvement of electric characteristics.

The heat treatment for supplying oxygen to the oxide semiconductor film is performed in an atmosphere of nitrogen, ultra-dry air, or a rare gas (argon, helium, or the like) preferably at a temperature of higher than or equal to 200° C. and lower than or equal to 400° C., for example, higher than or equal to 250° C. and lower than or equal to 350° C. It is preferable that the water content in the gas be lower than or equal to 20 ppm, preferably lower than or equal to 1 ppm, more preferably lower than or equal to 10 ppb.

In addition, an oxide semiconductor including a crystal with c-axis alignment (also referred to as a c-axis aligned crystalline oxide semiconductor (CAAC-OS)), which has a triangular or hexagonal atomic arrangement when seen from the direction of an a-b plane, a surface, or an interface, will be described. In the crystal, metal atoms are arranged in a layered manner, or metal atoms and oxygen atoms are arranged in a layered manner when seen from the direction perpendicular to the c-axis, and the direction of the a-axis or the b-axis is varied in the a-b plane (the crystal rotates around the c-axis).

In a broad sense, CAAC-OS means a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC-OS is not a single crystal, but does not consist only of an amorphous portion. Although the CAAC-OS includes a crystallized portion (crystalline portion), a boundary between one crystalline portion and another crystalline portion is not clear in some cases.

Nitrogen may be substituted for part of oxygen which is a constituent of the CAAC-OS. The c-axes of the crystalline portions included in the CAAC-OS may be aligned in one direction (e.g., a direction perpendicular to a surface of a substrate over which the CAAC-OS is formed, a surface of the CAAC-OS, or the like). Alternatively, the normals of the a-b planes of individual crystalline portions included in the CAAC-OS may be aligned in one direction (e.g., the direction perpendicular to a surface of a substrate over which the CAAC-OS is formed, a surface of the CAAC-OS, or the like).

The CAAC-OS is a conductor, a semiconductor, or an insulator depending on its composition or the like. The CAAC transmits or does not transmit visible light depending on its composition or the like.

An example of such a CAAC-OS is an oxide which is formed into a film shape and has a triangular or hexagonal atomic arrangement when observed from the direction perpendicular to a surface of the film or a surface of a substrate over which CAAC-OS is formed, and in which metal atoms are arranged in a layered manner or metal atoms and oxygen atoms (or nitrogen atoms) are arranged in a layered manner when a cross section of the film is observed.

An example of a crystal structure of the CAAC-OS will be described in detail with reference to FIGS. 18A to 18E, FIGS. 19A to 19C, and FIGS. 20A to 20C. In FIGS. 18A to 18E, FIGS. 19A to 19C, and FIGS. 20A to 20C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 18A to 18E, O surrounded by a circle represents tetracoordinate O and a double circle represents tricoordinate O.

Figure 18A:
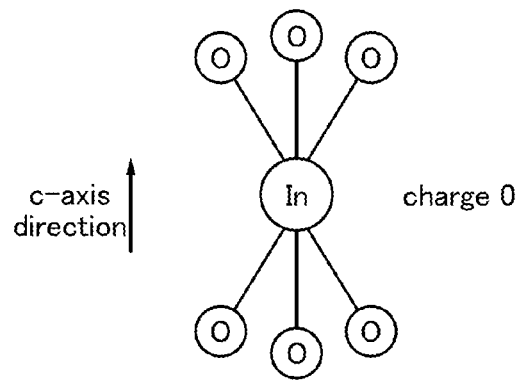
FIGS. 18A to 18E each show a crystal structure of an oxide semiconductor.

FIG. 18A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 18A is actually an octahedral structure, but is illustrated as a planar structure for simplicity. Note that three tetracoordinate O atoms exist in each of an upper half and a lower half in FIG. 18A. In the small group illustrated in FIG. 18A, electric charge is 0.

Figure 18D:
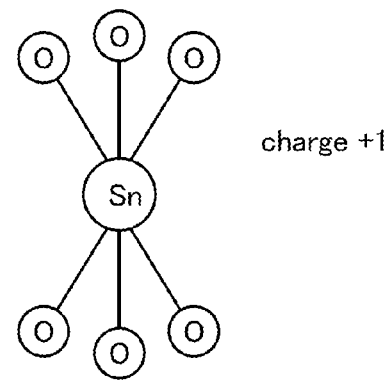
Figure 18B:
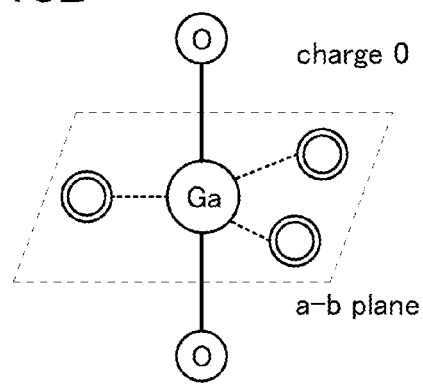

FIG. 18B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 18B. An In atom can also have the structure illustrated in FIG. 18B because an In atom can have five ligands. In the small group illustrated in FIG. 18B, electric charge is 0.

Figure 18E:
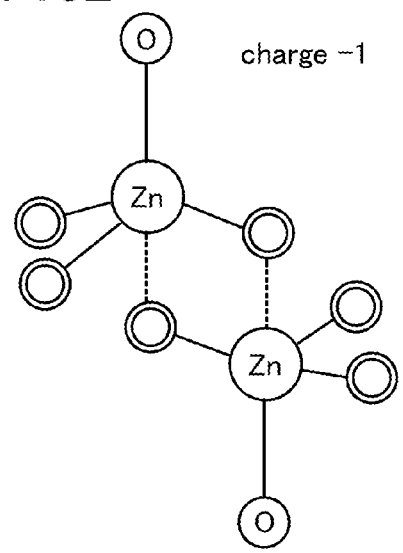
Figure 18C:
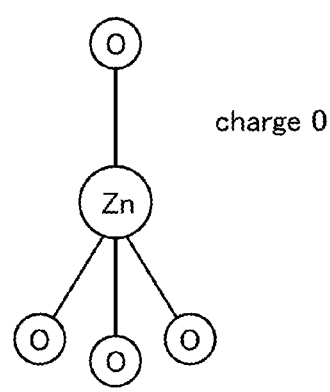

FIG. 18C illustrates a structure including one tetracoordinate Zn atom and four tetracoordinate O atoms proximate to the Zn atom. In FIG. 18C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 18C. In the small group illustrated in FIG. 18C, electric charge is 0.

FIG. 18D illustrates a structure including one hexacoordinate Sn atom and six tetracoordinate O atoms proximate to the Sn atom. In FIG. 18D, three tetracoordinate O atoms exist in each of an upper half and a lower half. In the small group illustrated in FIG. 18D, electric charge is +1.

FIG. 18E illustrates a small group including two Zn atoms. In FIG. 18E, one tetracoordinate O atom exists in each of an upper half and a lower half. In the small group illustrated in FIG. 18E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 18A each have three proximate In atoms in the downward direction, and the three O atoms in the lower half each have three proximate In atoms in the upward direction. The one O atom in the upper half with respect to the pentacoordinate Ga atom in FIG. 18B has one proximate Ga atom in the downward direction, and the one O atom in the lower half has one proximate Ga atom in the upward direction. The one O atom in the upper half with respect to the tetracoordinate Zn atom in FIG. 18C has one proximate Zn atom in the downward direction, and the three O atoms in the lower half each have three proximate Zn atoms in the upward direction. In this manner, the number of the tetracoordinated O atoms above the metal atom is equal to the number of the metal atoms proximate to and below each of the tetracoordinated O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

FIG. 19A illustrates a model of a medium group included in a layered structure of an In—Sn—Zn-based oxide. FIG. 19B illustrates a large group including three medium groups. Note that FIG. 19C illustrates an atomic arrangement in the case where the layered structure in FIG. 19B is observed from the c-axis direction.

In FIG. 19A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom is denoted by circled 3. Similarly, in FIG. 19A, one tetracoordinate O atom existing in each of an upper half and a lower half with respect to an In atom is denoted by circled 1. FIG. 19A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn-based oxide in FIG. 19A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 18E can be given. For example, with one small group including two Zn atoms, electric charge of one small group including a Sn atom can be cancelled, so that the total electric charge of the layered structure can be 0.

When the large group illustrated in FIG. 19B is repeated, a crystal of an In—Sn—Zn-based oxide ($In_2SnZn_3O_8$) can be obtained. Note that a layered structure of the obtained In—Sn—Zn-based oxide can be expressed as a composition formula, $In_2SnZn_2O_7(ZnO)_m$ (m is 0 or a natural number).

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

Figure 20A:
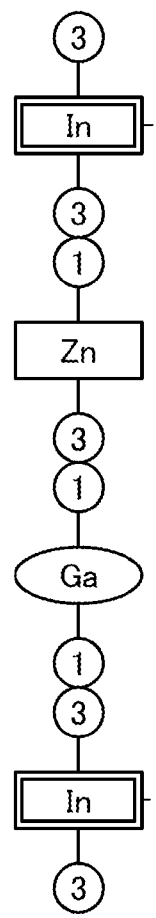
FIGS. 20A to 20C show a crystal structure of an oxide semiconductor.

As an example, FIG. 20A illustrates a model of a medium group included in a layered structure of an In—Ga—Zn-based oxide.

In the medium group included in the layered structure of the In—Ga—Zn-based oxide in FIG. 20A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

Figure 20B:
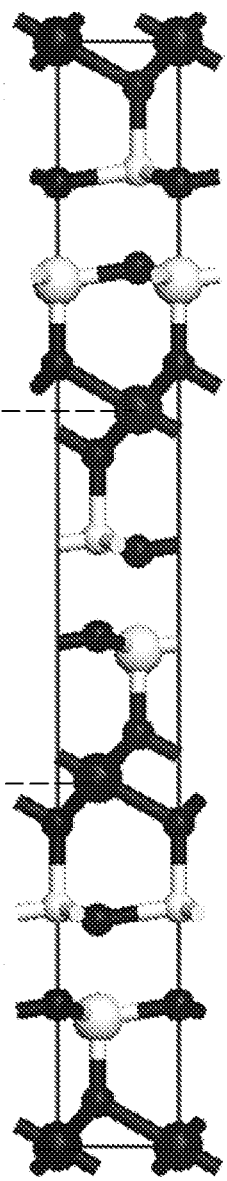
Figure 20C:
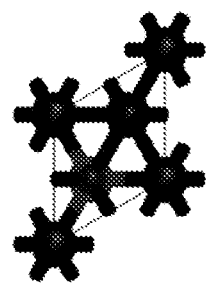

FIG. 20B illustrates a large group including three medium groups. Note that FIG. 20C illustrates an atomic arrangement in the case where the layered structure in FIG. 20B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn-based oxide, a large group can be formed using not only the medium group illustrated in FIG. 20A but also a medium group in which the arrangement of the In atom, the Ga atom, and the Zn atom is different from that in FIG. 20A.

This embodiment can be implemented in combination with the aforementioned embodiments.

EXAMPLE 1

A semiconductor device according to an embodiment of the present invention can suppress power consumption and have high reliability. With the use of the semiconductor device, an electronic device with low power consumption and high reliability can be provided. In particular, in the case of a portable electronic device which has difficulty in continuously receiving power, an advantage in increasing the continuous duty period can be obtained when a semiconductor device with low power consumption according to an embodiment of the present invention is added as a component of the device.

Figure 21A:
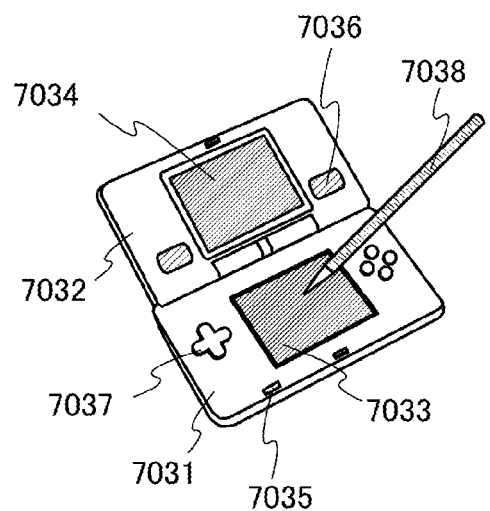
FIGS. 21A to 21C each illustrate an electronic device.
Figure 21B:
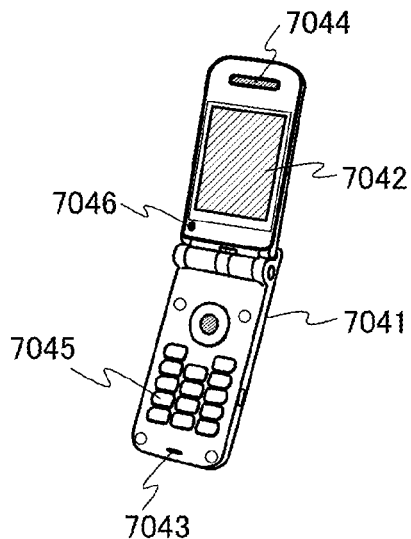
Figure 21C:
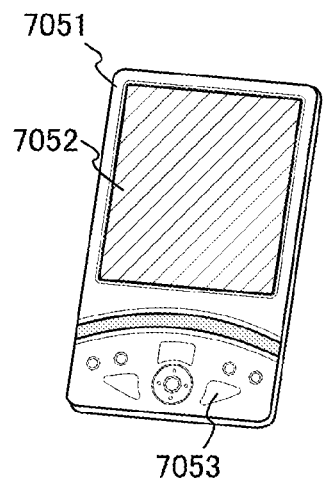

The semiconductor device according to an embodiment of the present invention can be used for display devices, laptops, or image reproducing devices provided with recording media (typically, devices which reproduce the content of recording media such as digital versatile discs (DVDs) and have displays for displaying the reproduced images). Other than the above, as an electronic device which can be provided with the semiconductor device according to an embodiment of the present invention, mobile phones, game machines including portable game machines, portable information terminals, e-book readers, cameras such as video cameras or digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. FIG. 21A to FIG. 21C show specific examples of these electronic devices.

FIG. 21A illustrates a portable game machine including a housing 7031, a housing 7032, a display portion 7033, a display portion 7034, a microphone 7035, speakers 7036, an operation key 7037, a stylus 7038, and the like. The semiconductor device relating to an embodiment of the present invention can be used for an integrated circuit which controls driving of the portable game machine. With the use of the semiconductor device which is an embodiment of the present invention for the integrated circuit which controls driving of the portable game machine, a highly reliable portable game machine with low power consumption can be provided. Although the portable game machine illustrated in FIG. 21A includes two display portions 7033 and 7034, the number of display portions included in the portable game machine is not limited to two.

FIG. 21B illustrates a mobile phone including a housing 7041, a display portion 7042, an audio input portion 7043, an audio output portion 7044, operation keys 7045, a light-receiving portion 7046, and the like. Light received in the light-receiving portion 7046 is converted into electric signals, whereby external images can be loaded. The semiconductor device relating to an embodiment of the present invention can be used for an integrated circuit which controls driving of the mobile phone. With the use of the semiconductor device according to an embodiment of the present invention for the integrated circuit for controlling driving of the mobile phone, a highly reliable mobile phone with low power consumption can be provided.

FIG. 21C illustrates a portable information terminal including a housing 7051, a display portion 7052, operation keys 7053, and the like. A modem may be incorporated in the housing 7051 of the portable information terminal illustrated in FIG. 21C. The semiconductor device relating to an embodiment of the present invention can be used for an integrated circuit which controls driving of the portable information terminal. With the use of the semiconductor device according to an embodiment of the present invention for the integrated circuit for controlling driving of the portable information terminal, a highly reliable portable information terminal with low power consumption can be provided.

This embodiment can be implemented by being combined as appropriate with any of the above-described embodiments.

This application is based on Japanese Patent Application serial no. 2011-133886 filed with Japan Patent Office on Jun. 16, 2011, the entire contents of which are hereby incorporated by reference.

What is claimed is:

1. A memory device comprising:
a first clocked inverter configured to be controlled by a first clock signal;
a first inverter, wherein an input terminal of the first inverter is electrically connected to an output terminal of the first clocked inverter;
a second clocked inverter configured to be controlled by a second clock signal, wherein an input terminal of the second clocked inverter is electrically connected to an output terminal of the first inverter, and an output terminal of the second clocked inverter is electrically connected to the output terminal of the first clocked inverter and the input terminal of the first inverter;
a transistor, wherein one of a source and a drain of the transistor is electrically connected to the output terminal of the first clocked inverter, the input terminal of the first inverter, and the output terminal of the second clocked inverter; and
a capacitor, wherein one electrode of the capacitor is electrically connected to the other of the source and the drain of the transistor,
wherein the first clocked inverter is configured to be controlled independently of the second clocked inverter, and
wherein the transistor comprises an oxide semiconductor in a channel formation region.

2. The memory device according to claim 1, wherein the oxide semiconductor comprises indium, gallium, and zinc.

3. The memory device according to claim 1, wherein the oxide semiconductor is a crystalline oxide semiconductor.

4. The memory device according to claim 1,
wherein each of the first clocked inverter, the second clocked inverter, and the first inverter comprises an n-channel type transistor and a p-channel type transistor, and
wherein each of the n-channel type transistor and the p-channel type transistor comprises silicon in a channel formation region.

5. The memory device according to claim 4,
wherein the n-channel type transistor and the p-channel type transistor are provided over a substrate, and
wherein the transistor is provided over the n-channel type transistor and the p-channel type transistor.

6. The memory device according to claim 4, wherein the channel formation region of the n-channel type transistor and the channel formation region of the p-channel type transistor are provided in a semiconductor substrate.

7. A semiconductor device comprising:
the memory device according to claim 1; and
an arithmetic logic unit operationally connected to the memory device.

8. A memory device comprising:
a first clocked inverter electrically connected to a first line configured to be supplied with a first clock signal and a second line configured to be supplied with an inverted signal of the first clock signal;
a first inverter, wherein an input terminal of the first inverter is electrically connected to an output terminal of the first clocked inverter;
a second clocked inverter electrically connected to a third line configured to be supplied with a second clock signal and a fourth line configured to be supplied with an inverted signal of the second clock signal, wherein an input terminal of the second clocked inverter is electrically connected to an output terminal of the first inverter, and an output terminal of the second clocked inverter is electrically connected to the output terminal of the first clocked inverter and the input terminal of the first inverter;
a transistor, wherein one of a source and a drain of the transistor is electrically connected to the output terminal of the first clocked inverter, the input terminal of the first inverter, and the output terminal of the second clocked inverter; and
a capacitor, wherein one electrode of the capacitor is electrically connected to the other of the source and the drain of the transistor,
wherein the transistor comprises an oxide semiconductor in a channel formation region.

9. The memory device according to claim 8, wherein the oxide semiconductor comprises indium, gallium, and zinc.

10. The memory device according to claim 8, wherein the oxide semiconductor is a crystalline oxide semiconductor.

11. The memory device according to claim 8,
wherein each of the first clocked inverter, the second clocked inverter, and the first inverter comprises an n-channel type transistor and a p-channel type transistor, and
wherein each of the n-channel type transistor and the p-channel type transistor comprises silicon in a channel formation region.

12. The memory device according to claim 11,
wherein the n-channel type transistor and the p-channel type transistor are provided over a substrate, and
wherein the transistor is provided over the n-channel type transistor and the p-channel type transistor.

13. The memory device according to claim 11, wherein the channel formation region of the n-channel type transistor and the channel formation region of the p-channel type transistor are provided in a semiconductor substrate.

14. A semiconductor device comprising:
the memory device according to claim 8; and
an arithmetic logic unit operationally connected to the memory device.

15. A memory device comprising:
a memory element comprising a plurality of inverters configured to hold one-bit data;
a transistor, wherein one of a source and a drain of the transistor is electrically connected to the memory element; and
a capacitor, wherein one electrode of the capacitor is electrically connected to the other of the source and the drain of the transistor,
wherein the plurality of inverters comprises a first clocked inverter and a second clocked inverter,
wherein the first clocked inverter is configured to be controlled by a first clock signal, wherein the second clocked inverter is configured to be controlled by a second clock signal, wherein the first clocked inverter is configured to be controlled independently of the second clocked inverted, and wherein the transistor comprises an oxide semiconductor in a channel formation region.

16. The memory device according to claim 15, wherein the oxide semiconductor comprises indium, gallium, and zinc.

17. The memory device according to claim 15, wherein the oxide semiconductor is a crystalline oxide semiconductor.

18. The memory device according to claim 15, wherein each of the first clocked inverter and the second clocked inverter comprises an n-channel type transistor and a p-channel type transistor, and wherein each of the n-channel type transistor and the p-channel type transistor comprises silicon in a channel formation region.

19. The memory device according to claim 18 wherein the n-channel type transistor and the p-channel type transistor are provided over a substrate, and wherein the transistor is provided over the n-channel type transistor and the p-channel type transistor.

20. The memory device according to claim 18, wherein the channel formation region of the n-channel type transistor and the channel formation region of the p-channel type transistor are provided in a semiconductor substrate.

21. A semiconductor device comprising:

the memory device according to claim 15; and an arithmetic logic unit operationally connected to the memory device.

* * * * *